(12) United States Patent
Sun et al.

(10) Patent No.: US 7,675,370 B2
(45) Date of Patent: Mar. 9, 2010

(54) DYNAMIC CALIBRATION TECHNIQUES FOR DIGITALLY CONTROLLED OSCILLATOR

(75) Inventors: Bo Sun, Carlsbad, CA (US); Gary John Ballantyne, Christchurch (NZ); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 75 days.

(21) Appl. No.: 12/138,263

(22) Filed: Jun. 12, 2008

(65) Prior Publication Data

US 2009/0309666 A1    Dec. 17, 2009

(51) Int. Cl.
G01R 23/00 (2006.01)
H03B 5/12 (2006.01)

(52) U.S. Cl. .......................................... 331/44; 331/179

(58) Field of Classification Search .................. 331/44, 331/117 R, 117 FE, 117 D, 177 R, 177 V, 331/179

See application file for complete search history.

(56) References Cited

U.S. PATENT DOCUMENTS 4,746,879 A * 5/1988 Ma et al. ...................... 331/44

* cited by examiner

*Primary Examiner*—David Mis
(74) *Attorney, Agent, or Firm*—Jiayu Xu

(57) ABSTRACT

Techniques for calibrating digitally controlled oscillators (DCOs) are disclosed. In an aspect of the disclosure, an initial set of control codes for operating the DCO is determined. A range of output frequencies produced from the initial set is identified. Gaps or instances of overlap are identified in the frequency range. For the overlap case, control codes are removed from the initial set that correspond to the overlap instance to establish a revised set. For the gap case, control codes are added to the initial set for producing frequencies values that fill the gap. An apparatus for performing the same is also disclosed.

44 Claims, 16 Drawing Sheets

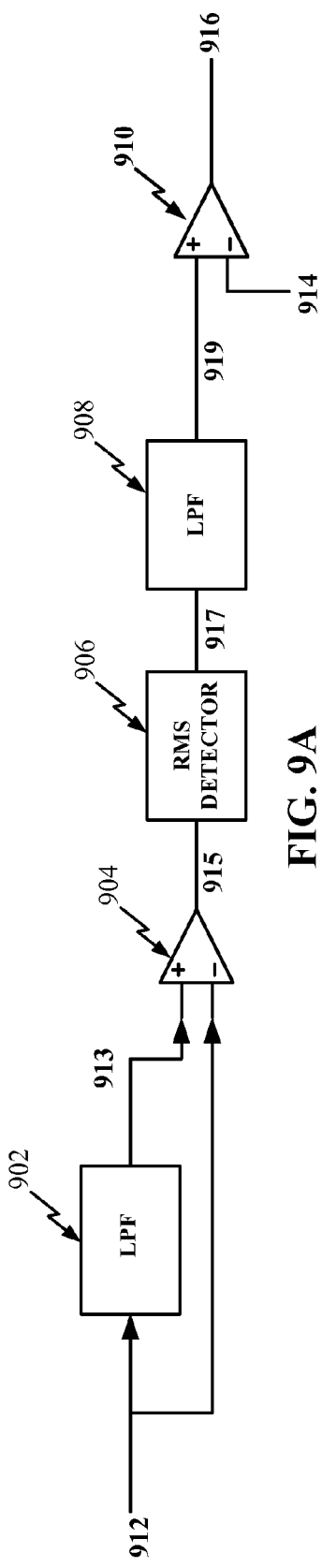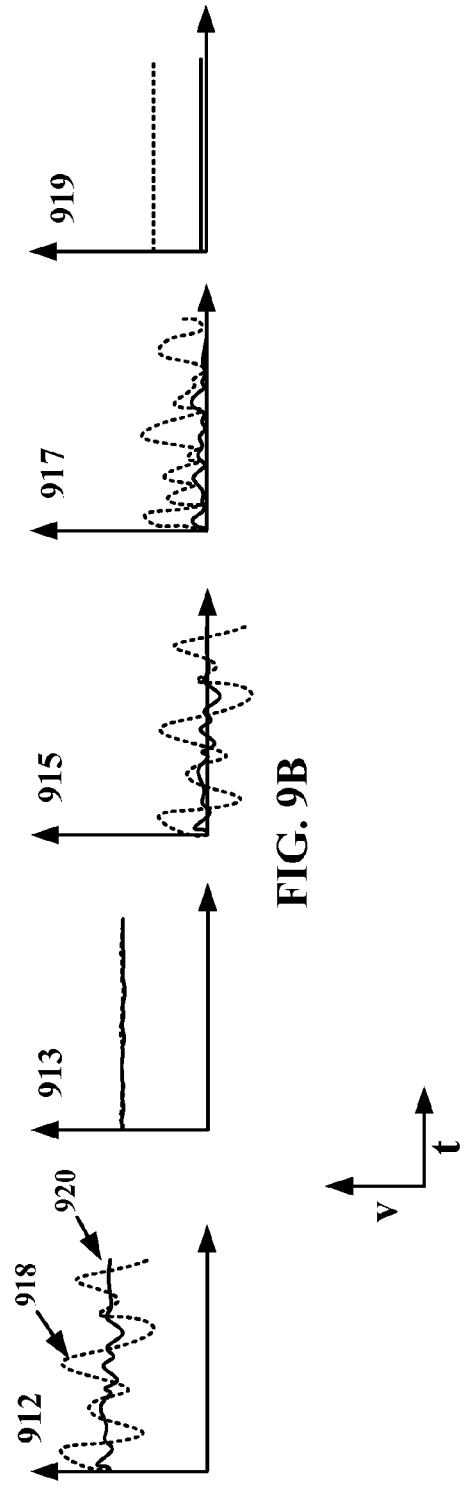
FIG. 9A
FIG. 9B

DYNAMIC CALIBRATION TECHNIQUES FOR DIGITALLY CONTROLLED OSCILLATOR

BACKGROUND

1. Field

This disclosure relates generally to the field of electronics, and more specifically, but not exclusively, to digitally controlled oscillators.

2. Background

A digitally controlled oscillator (DCO), sometimes referred to as a numerically controlled oscillator, is an electronic circuit for synthesizing a range of frequencies from a fixed reference clock. The output frequency generated by the DCO at a particular time is a function of the value a digital input or control code. DCOs may be used as frequency synthesizers for generating waveforms for a variety of electronic circuit-based applications. DCOs are being increasingly employed, for example, in the arenas of wireless communications, high resolution imaging, high speed networking, display technology, digital signal processing, and a host of other circuit-intensive areas.

For applications involving conventional wireless communications devices including mobile phones and portable computers, the DCO-produced waveforms may be used to implement functions such as clock and data recovery, carrier wave synthesis, signal encoding/decoding and modulation/demodulation, programmable waveform generation, and the like. Many recent applications involving wireless communications have seen the widespread use of DCOs implemented within digital phase locked loops (DPLLs). Due to its digital nature, the DCO can offer fast switching between output frequencies, high resolution, and operation over a broad frequency spectrum. DCOs may also offer superior noise rejection over conventional circuit techniques by reducing the number of analog circuit components, and reducing or eliminating noise susceptible parameters such as oscillator control voltages, etc.

As the demand for smaller DCOs for fast switching between more granular output frequencies continues to escalate, so too have the problems associated with parasitic circuit values and impedance mismatches for the various circuit elements that make up the DCOs. In practical implementations, linear input codes tend to produce nonlinear output frequencies from DCOs—specifically, gaps or instances of overlap in a plot of output frequency versus input control code.

A need persists in the art for effectively identifying and correcting these instances of nonlinearity in a DCO.

SUMMARY

Techniques for calibrating digitally controlled oscillators (DCOs) are disclosed. An initial set of control codes for operating the DCO may be determined. A range of output frequencies produced from the initial set may be identified. Gaps or instances of overlap may be identified in the frequency range. For the overlap case, control codes may be removed from the initial set that correspond to the overlap instance to establish a revised set. For the gap case, control codes may be added to the initial set for producing frequencies values that fill the gap In one aspect of the disclosure, a method of calibrating a digitally controlled oscillator (DCO) includes determining an initial set of control codes for operating the DCO, identifying a range of output frequencies produced from the initial set, identifying at least one instance of overlap in the frequency range, and removing control codes from the initial set that correspond to the at least one overlap instance to establish a revised set.

In another aspect of the disclosure, a method of calibrating a digitally controlled oscillator (DCO) includes determining an initial set of control codes for operating the DCO, identifying a range of output frequencies produced from the initial set, identifying at least one gap in the frequency range, and adding control codes to the initial set, the added control codes corresponding to output frequency values that substantially fill the at least one gap.

In yet another aspect of the disclosure, a wireless communication device includes a digitally controlled oscillator (DCO), and a processing system configured to determine an initial set of control codes for operating the DCO, to identify a range of output frequencies produced from the initial set, to identify at least one instance of overlap in the frequency range, and to remove control codes from the initial set that correspond to the at least one overlap instance to establish a revised set.

In still another aspect of the disclosure, a wireless communication device, includes a digitally controlled oscillator (DCO), and a processing system configured to determine an initial set of control codes for operating the DCO, to identify a range of output frequencies produced from the initial set to identify at least one gap in the frequency range, and to add control codes to the initial set, the added control codes corresponding to output frequency values that substantially fill the at least one gap.

In a further aspect of the disclosure, an apparatus includes a digitally controlled oscillator (DCO), means for determining an initial set of control codes for operating the DCO, means for identifying a range of corresponding output frequencies, means for identifying at least one instance of overlap in the frequency range, and means for removing control codes from the initial set that correspond to the at least one overlap instance to establish a revised set.

In still a further aspect of the disclosure, an apparatus includes a digitally controlled oscillator (DCO), means for determining an initial set of control codes for operating the DCO, means for identifying a range of output frequencies produced from the initial set, means for identifying at least one gap in the frequency range, and means for adding control codes to the initial set, the added control codes corresponding to output frequency values that substantially fill the at least one gap.

In another aspect of the disclosure, a computer-program product including a machine-readable medium including instructions executable by a machine for performing a method of calibrating a digitally controlled oscillator (DCO) includes determining an initial set of control codes for operating the DCO, identifying a range of output frequencies produced from the initial set, identifying at least one instance of overlap in the frequency range, and removing control codes from the initial set that correspond to the at least one overlap instance to establish a revised set.

In a further aspect of the disclosure, a computer-program product including a machine-readable medium including instructions executable by a machine for performing a method of calibrating a digitally controlled oscillator (DCO) includes determining an initial set of control codes for operating the DCO, identifying a range of output frequencies produced from the initial set, identifying at least one gap in the frequency range, and adding control codes to the initial set, the added control codes corresponding to output frequency values that substantially fill the at least one gap.

It is understood that other aspects of the invention will become readily apparent to those skilled in the art from the following detailed description, wherein various aspects of the invention are shown and described by way of illustration. As will be realized, the invention is capable of other and different configurations and implementations and its several details are capable of modification in various other respects, all without departing from the scope of this disclosure. Accordingly, the drawings and detailed description are to be regarded as illustrative in nature and not as restrictive.

BRIEF DESCRIPTION OF THE DRAWINGS

FIG. 9A is a diagram of a circuit for measuring DCO discontinuities using a closed loop PLL.

FIG. 9B is a series of plots showing the waveforms for the circuit of FIG. 9A.

DETAILED DESCRIPTION

The detailed description set forth below in connection with the appended drawings is intended as a description of various configurations of the invention and is not intended to represent the only configurations in which the invention may be practiced. The detailed description includes specific details for the purpose of providing a thorough understanding of the invention. However, it will be apparent to those skilled in the art that the invention may be practiced without these specific details. In some instances, well-known structures and components are shown in block diagram form in order to avoid obscuring the concepts of the invention.

DCOs have increasingly been implemented within wireless communication devices that transmit and receive wireless signal. Where a DCO is used to generate carrier waveforms, baseband signals are modulated on the carrier waveforms, and then the modulated carrier waveforms are transmitted to other devices as wireless signals. The receiving devices may use a DCO, in turn, to synthesize the carrier and remove the baseband signal for demodulation.

Figure 1A:
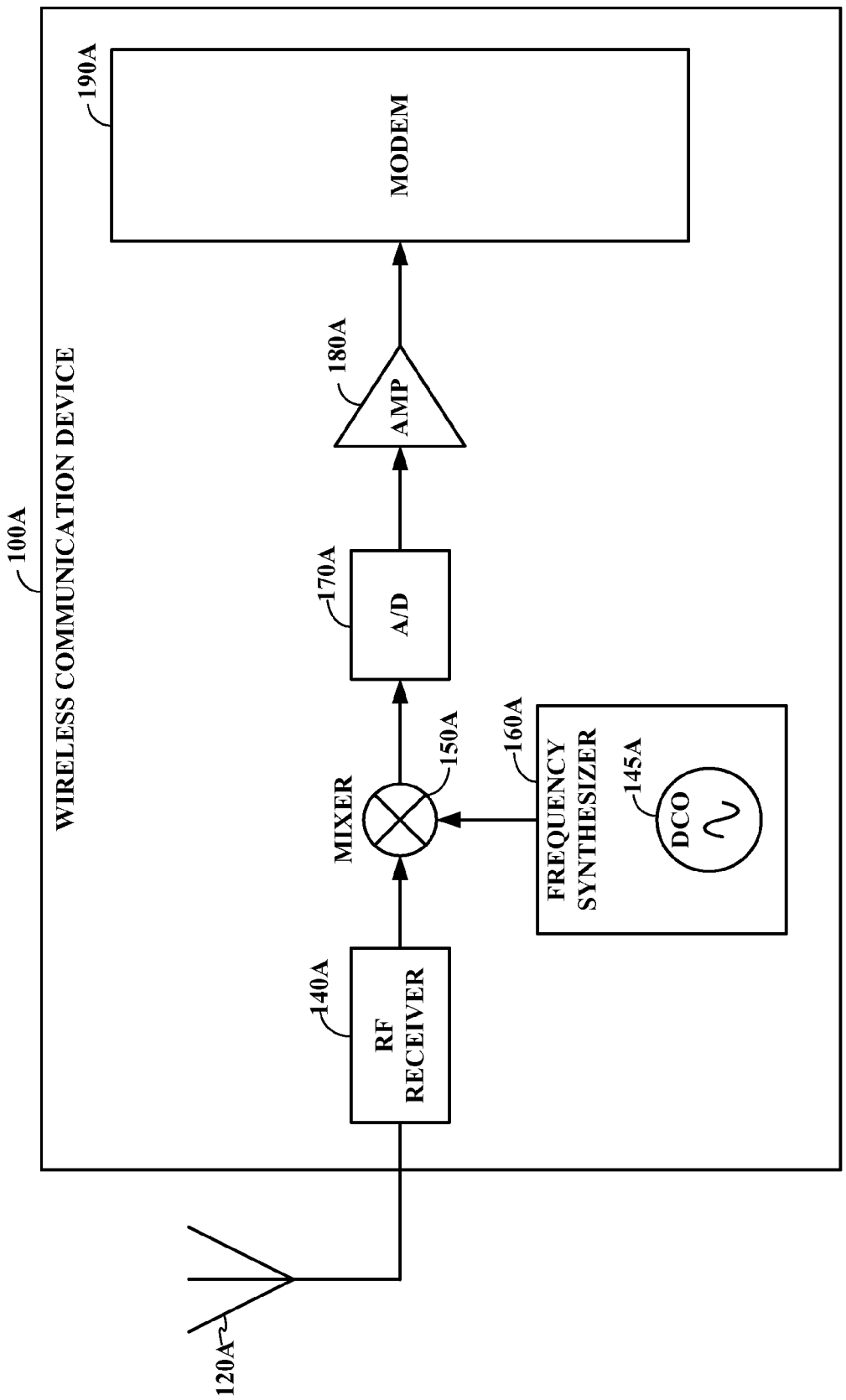
FIG. 1A is a block diagram of a wireless communication device incorporating a wireless receiver.
Figure 1B:
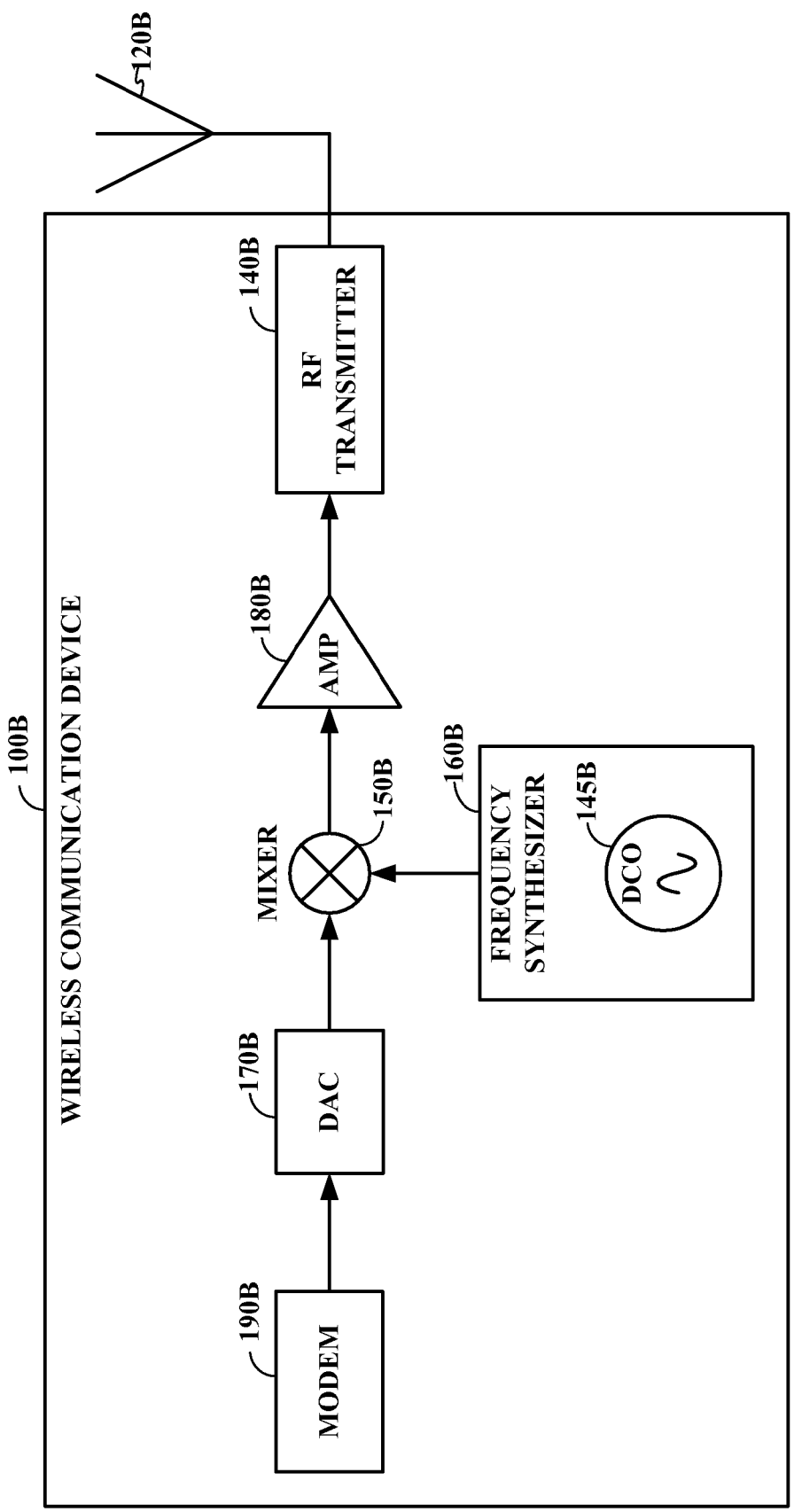
FIG. 1B is a block diagram of a wireless communication device incorporating a wireless transmitter.

FIGS. 1A and 1B are block diagrams of wireless communication devices 100A and 100B associated with wireless signal reception and transmission, respectively. Each of the wireless communication devices 100A and 100B contains a respective frequency synthesizer 160A and 160B. The respective frequency synthesizer 160A and 160B includes a DCO 145A and 145B for generating an output waveform of a particular frequency that is a function of a digital control code input into the respective DCO (not shown). The DCO in one aspect may include a plurality of tuning elements and an inductor capacity "tank" configuration, depending on the specific design. Illustrative architectures of an DCOs according to this disclosure are discussed below.

The wireless communication device 100A of FIG. 1A may implement a so-called "Zero-IF" architecture, although this disclosure is not limited in this respect. In Zero-IF architectures, WCD 100A converts incoming signals directly into baseband signals and, specifically, does not first convert the received signals to intermediate frequency (IF) signals.

Wireless communication device 100A includes antenna 120A that receives incoming wireless signals. By way of example, the incoming wireless signals may comprise code division multiple access (CDMA) modulated signals sent from a CDMA base station. GSM signals or other types of wireless signals, however, may also be supported. In the illustrated example, wireless signal received by antenna 120A can be processed by RF receiver 140A, such as by passing the signal through low-noise amplifier (LNA) and one or more filters. The wireless signal is then mixed down to baseband by mixer 150A (sometimes called a "down-mixer" or "de-mixer"). Mixer 150A may receive reference waveforms produced by frequency synthesizer 160A which may implement a DCO to generate an oscillating frequency. As compared to the voltage controlled oscillator—the DCO's analog based counterpart—the DCO may improve the frequency synthesis process, possibly reduce noise in the system, and allow for simplification of various components of frequency synthesizer 160A and device 100A.

Mixer 150A produces baseband signals which can be filtered and sampled by analog-to-digital (A/D) converter 170A to produce corresponding digital samples of the signals. One or more amplifiers 180A, such as a digital voltage gain amplifier (VGA) or another suitable amplifier type, may be used to appropriately scale the digital baseband signal, either by amplifying or by attenuating the digital values according to gain values received from an automatic gain control unit (not shown).

After the scaling by amplifier 180A, the scaled digital baseband signal is provided to modem unit 190A, which may comprise a demodulator. For CDMA-based applications, modem 190A may include a so-called "RAKE" receiver, which separates and tracks signals received from different sources, e.g., different base stations, or signals received from the same source via multiple propagation paths, i.e., multi-path signals.

For example, modem unit 190A may include a number of "fingers" that perform dispreading, Walsh decovering and accumulation, pilot time tracking and frequency tracking Each finger of modem unit 190A outputs pilot and data symbols for the corresponding path. Symbol demodulation and/or other signal processing may then be performed on the pilot and data symbols.

As desired, wireless communication device 100A may also include additional components (not shown) such as filters and various digital or analog signal processing components. Wireless communication device may alternatively or additionally be employed to process signals using time division multiple access (TDMA), or frequency division multiple access (FDMA), or CDMA, or some combination of these protocols.

Of course, for other standards or techniques, RAKE fingers may not be used, although the DCO described herein may be equally useful for such standards or techniques.

FIG. 1B is a block diagram of a wireless communication device incorporating a wireless transmitter. The devices in FIGS. 1A and 1B may be part of the same wireless communication device (for example, they may be part of a wireless transceiver); alternatively, they may be separate devices, or discrete modules on the same device. The wireless communication device 100B in FIG. 1B may function in a similar manner as the wireless communication device of FIG. 1A, except that a transmission function is performed.

A wireless signal may be output from modem unit 190B, where modem unit 190B may comprise a modulator for modulating a signal for transmission over antenna 120B. For example, in a CDMA system, the signal may be modulated at modem unit 190B with a PN code and/or spread with a Walsh code, or both, to produce a digital baseband signal. The digital signal output from modem unit 190B may thereupon by converted to an analog waveform by digital to analog converter (DAC) 170 to produce an analog baseband signal.

Frequency synthesizer 160B provides carrier waveforms to mixer 150B (sometimes called an "up-mixer"). Frequency synthesizer 160B includes DCO 145B. Mixer 150B combines the analog baseband signal into the carrier signal and forwards the modulated carrier signal to amplifier 180B for scaling. Amplifier 180B may include one or more voltage gain amplifiers (VGAs), driver amplifiers (DAs), and power amplifiers (PAs), depending on the circuit type and application. The different amplifiers may reside on the same integrated circuit chip, or multiple different chips or modules. Once the modulated signal has been adequately amplified or attenuated, RF transmitter 140B may transmit the modulated RF signal from wireless communication device 100B via antenna 120B.

It will be appreciated that the wireless communication devices 100A and 100B of FIGS. 1A and 1B are merely exemplary devices that can utilize the DCO calibration techniques described herein. Many other types of devices can also equally benefit from the teachings of this disclosure, including other types of wireless communication devices, or more generally, any wireless or wired devices that uses a DCO.

As noted above, some wireless standards make use of two or more communication techniques, such as GSM systems, which use a combination of TDMA and FDMA modulation. GSM stands for Global System for Mobile Communications. A number of wireless networking standards, and other wireless communication standards and techniques have also been developed, including several IEEE 802.11 standards, Bluetooth standards, and emerging ultra-wideband (UWB) techniques and standards. Circuits employing these standards and techniques may use oscillators in general, and DCOs in particular, in the generation and demodulation of wireless signals.

Exemplary wireless communication devices include cellular or satellite radiotelephones, radiotelephone base stations, computers that support one or more wireless networking standards, wireless access points for wireless networking, PCM-CIA cards incorporated within portable computers, direct two-way communication devices, personal digital assistants (PDAs) equipped with wireless communication capabilities, and the like.

Examples of computing devices used in wireless networks, which can equally benefit from the DCO calibration techniques described in this disclosure, may include laptop or desktop computers, mobile phones such as cellular radiotelephones and satellite radiotelephones, data terminals, data collection devices, PDAs and other portable and non-portable computing devices.

Figure 2A:
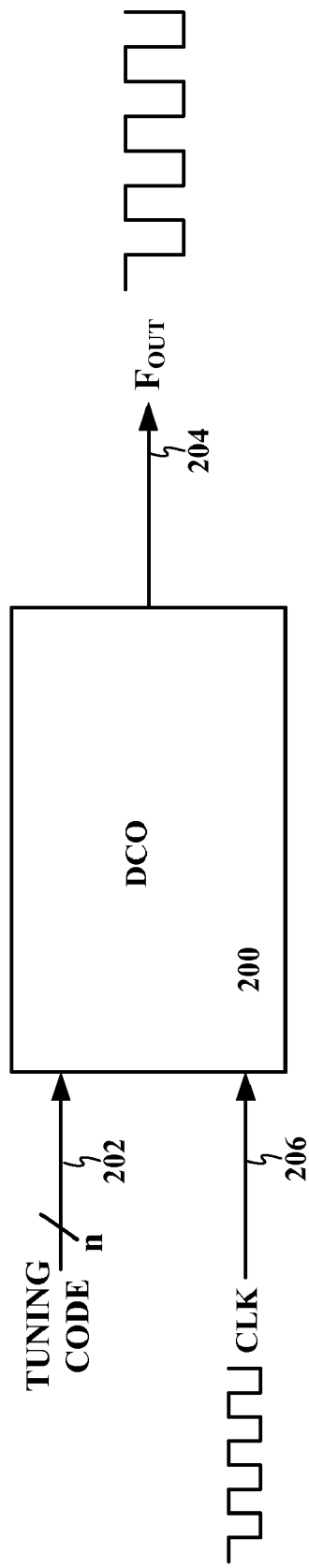
FIG. 2A is a block diagram of a digitally controlled oscillator (DCO).

FIG. 2A is a block diagram of an exemplary digitally controlled oscillator (DCO) 200. In this example, DCO 200 is an inductor-capacitor circuit that produces an oscillating output having a frequency that is a function of the LC circuit. The output frequency may be changed, for example, by changing the capacitance of components of the DCO 200. DCO 200 includes two inputs. At a first input 202, DCO 200 receives an n-bit wide digital word or tuning code. A reference clock signal is streamed into the clock input 206. At output 204, a signal of frequency $F_{OUT}$ is produced. $F_{OUT}$ is adjusted by changing the value of the tuning code at input 202. In this example, $F_{OUT}$ is linearly inversely proportionally to the input tuning code. Thus, if n=4, and the input tuning code is 0100 a frequency F1 may be produced; if the tuning code is then changed to 0101, in the ideal case a frequency F2 that is slightly lower than F1 may thereupon be produced.

The output signal may be a square wave (as shown), a sine wave, or any other form, depending on the specific circuit configuration of the DCO.

In practice, the DCO comprises a number of tuning units and tuning elements for incrementally adjusting the frequency in response to a set of digital inputs.

Figure 2B:
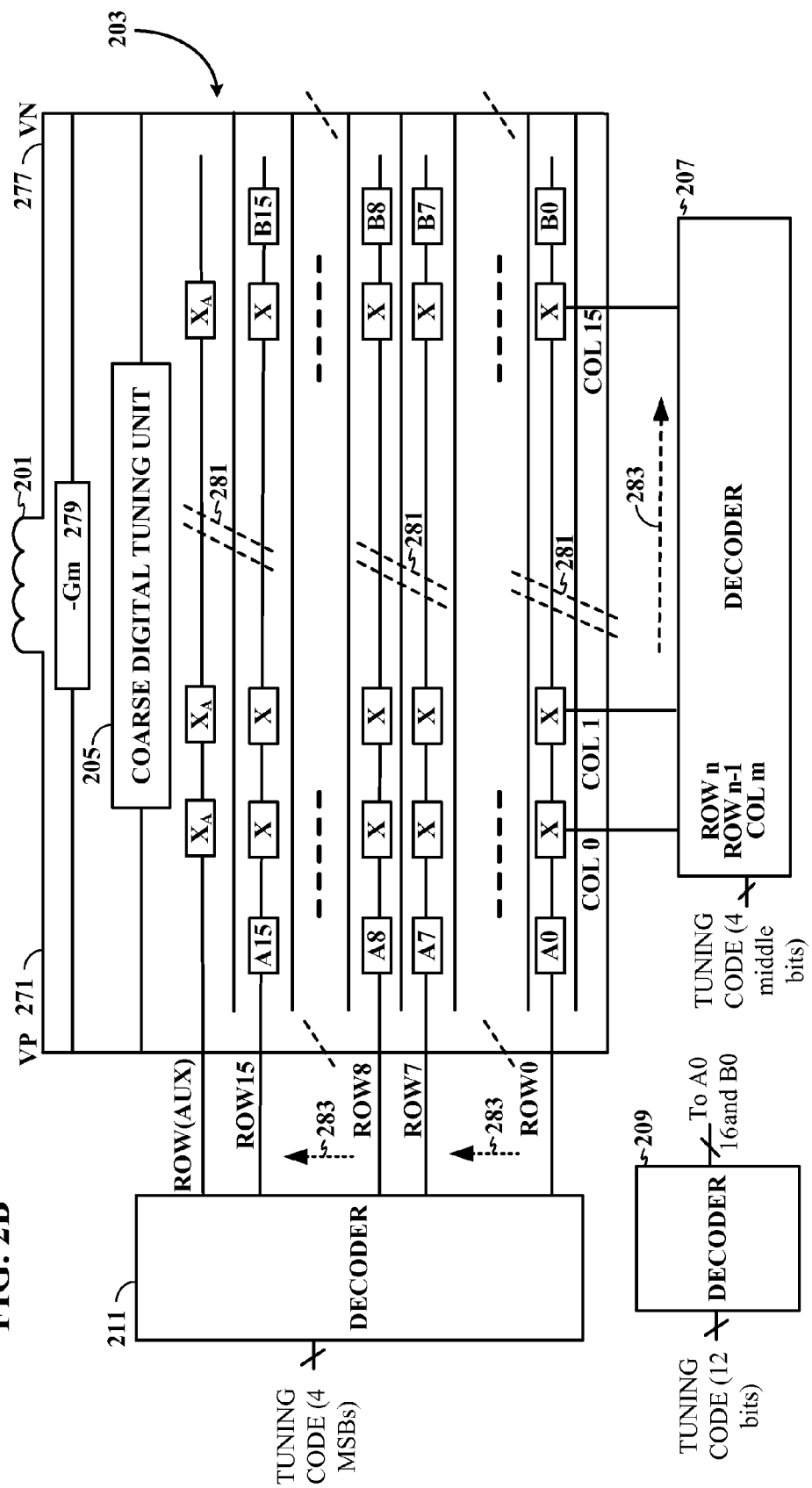
FIGS. 2B is a circuit diagram of an illustrative DCO.

FIG. 2B is a circuit diagram of a DCO 203 according to an aspect of the disclosure. It will be appreciated that the DCO may be configured in a variety of ways depending on the application. The input to the DCO 203 is the tuning code, which in this illustration is a 12 bit binary number. The DCO output is a voltage waveform (for example, at nodes 271 and 277) at a frequency determined in part by the tuning code, as discussed below.

The example in FIG. 2B uses a plurality of decoders. It will be appreciated by those in the art, however, that another number of decoders, or in some instances one decoder, may be used, depending on the configuration. Alternatively, the decoding function may be performed in software, through one or more digital signal processors, or other hardware. In this example, the four most significant bits of the 12 bit tuning code are input into decoder 211, which in turn are used to provide decoded signals to ROW0 through ROW15 as well as ROW(AUX). DCO 203 includes a matrix of sixteen rows (ROW0 to ROW15) and sixteen columns (COL 0 to COL 15). Each of COL 0 through COL 15 is associated with one of sixteen X tuning units (the slashes 281 indicate that the X and $X_A$ tuning units are repeated throughout the middle columns although not shown explicitly). Each of the sixteen X tuning units is also found in one of the sixteen rows ROW 0 through ROW 15. Thus, in this configuration, each of the 16×16=256 X tuning units may be addressed by a particular row and column. In addition to the sixteen X tuning units, each row from ROW0-ROW15 includes an A0 tuning unit and a B0 tuning unit. Each output of the ROW0-ROW15 outputs from decoder 211 feeds into each one corresponding A unit, the sixteen X units, and one B unit. Further, sixteen $X_A$ auxiliary tuning units are controlled by a signal ROW(AUX) from decoder 211, which may comprise a multi-bit signal.

The entire 12 bit tuning code in this example is also input into decoder 209, which produces 16 bits of decoded data for controlling tuning units A0 and B0. The four middle bits of the 12 bit tuning code may be input into decoder 207 to produce the decoded bits for controlling COL 0 through COL 15.

In the configuration of FIG. 2B, DCO 203 includes an inductor-capacitor circuit that generates a transconductance 279 (-Gm). Element 201 represents the inductor coil of the inductor-capacitor circuit. The output of DCO 203 toggles between a positive voltage VP (node 271) and a negative voltage VN (node 277). The frequency of this toggling is digitally controlled by a coarse digital tuning unit 205 and a plurality of sets of fine digital tuning elements, e.g, A0-A15, X, $X_A$, and B0-B15. Together, sets A0-A15, X, $X_A$ and B0-B15 make up a matrix of fine tuning elements that may further be organized to drive output waveforms for individual segments of the DCO as discussed below.

Coarse digital tuning unit 205 may in one aspect be used to provide larger output frequency adjustments, e.g., on the order of 5 MHz per step (or LSB; with 8 bit binary control total, the coarse tuning range is about 256×5 MHz=1.28 GHz), whereas the fine tuning elements may be used to provide fine tuning, e.g., on the order of 4 KHz or less per step (or LSB; with 12 bit binary control, the total fine tuning range is about 4096×4 KHz=16.384 MHz.).

In the example above, the decoders may be used to provide mappings between one or more bits (or each bit) of the input control code and one or more fine tuning elements. The mapping for the decoder may be provided by the values obtained for the gap and overlap measurements, as discussed below. One skilled in the art, upon perusal of this written description, will appreciate that these mappings may be achieved through various known techniques without departing from the spirit and scope of the present disclosure.

In other embodiments, an auxiliary "mirror" array of fine tuning units (such as $X_A$) may reside adjacent the array of fine tuning units in FIG. 112 to provide the auxiliary components for the gap case and also for the overlap case (described below). In other cases, these elements may reside outside the circuit layout of the DCO, outside the semiconductor die, or outside the module in which the DCO circuit resides.

Figure 2C:
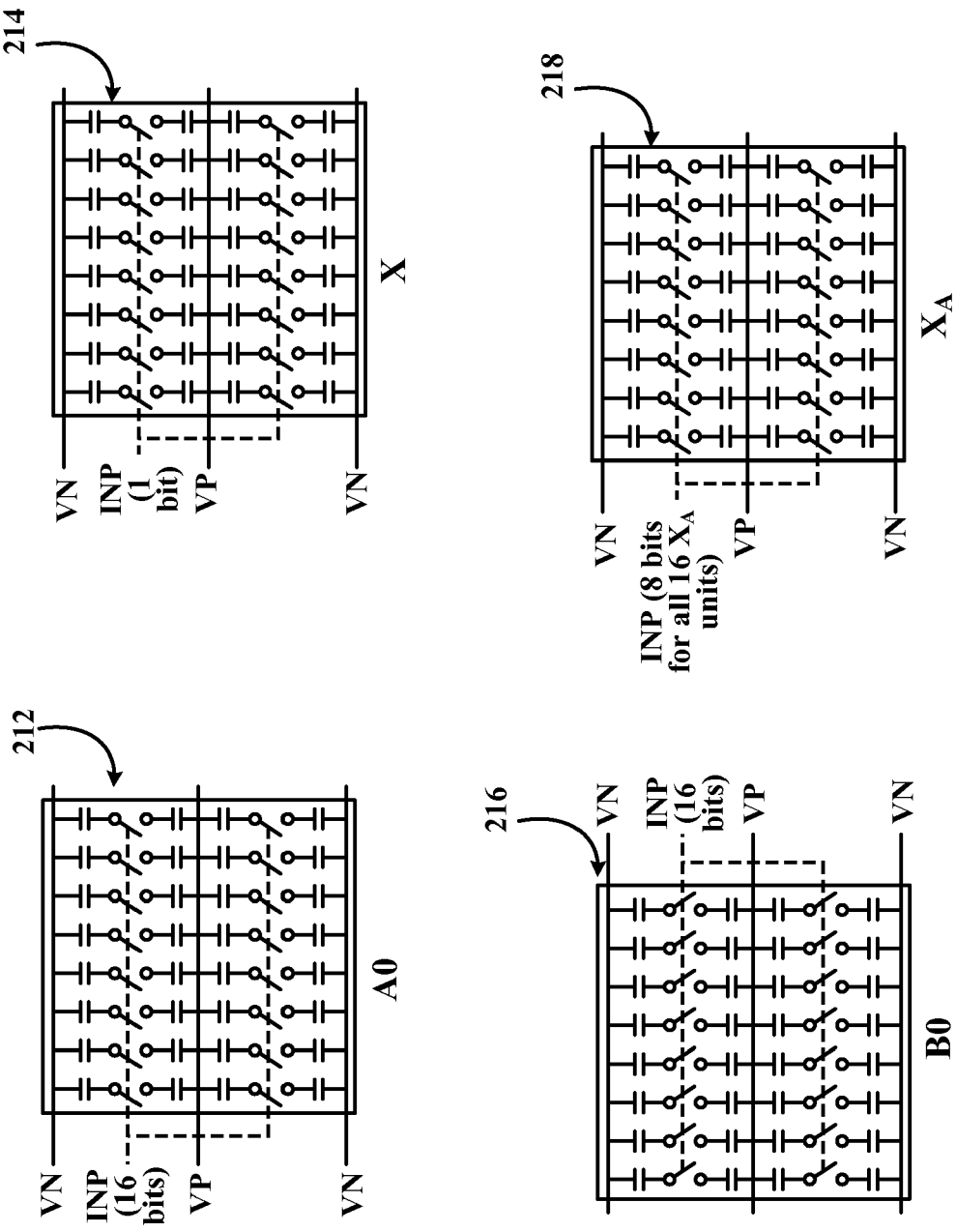
FIG. 2C is a circuit diagram of illustrative tuning units.

FIG. 2C shows individual units 212, 214, 216, and 218, which correspond, respectively, to tuning units A0, X, and B0 and $X_A$. Each tuning unit is coupled to outputs VP and VN. Input INP corresponds to one or more bits of input control codes, which control one or more switches (e.g., a gate of a CMOS transistor) in the tuning unit for granular level adjusting of the DCO output frequency. Input INP controls which capacitors in the tuning elements (see FIG. 2D) of tuning units 212, 214, 216, and 218 are on and off, and can thereby add or remove incremental amounts of capacitance to or from the circuit to achieve a desired output frequency. In the circuit shown, activating the switch will add additional capacitance to the tuning unit, thereby reducing the frequency of the output waveform incrementally. In one example, a logical one ("high" voltage level) will turn on the NMOS transistor and thereby activate the switch, accomplishing this goal. For this reason, more logical ones—and hence a higher tuning code—result in a lower frequency in one aspect.

In the example of FIG. 2C, each of the tuning units 212, 214, 216, and 218 are structurally identical, although this need not be the case. Each contains sixteen individual tuning elements, which may comprise by way of example, two main capacitors (see FIG. 2D) each used for making the adjustments. In the simplified illustration shown, sixteen bits are input into tuning unit A0 such that a separate bit may be used to control one of the sixteen individual tuning elements. For tuning unit X, a single bit may be used to control all sixteen elements such that all switches in the tuning unit X are either concurrently on or off. In other embodiments, two or more bits may be used to control the tuning elements in tuning element X. Tuning unit B0 functions in this example in a similar manner to tuning unit A0. It will be appreciated that different types and numbers of tuning units and tuning elements may be equally suitable.

Figure 2D:
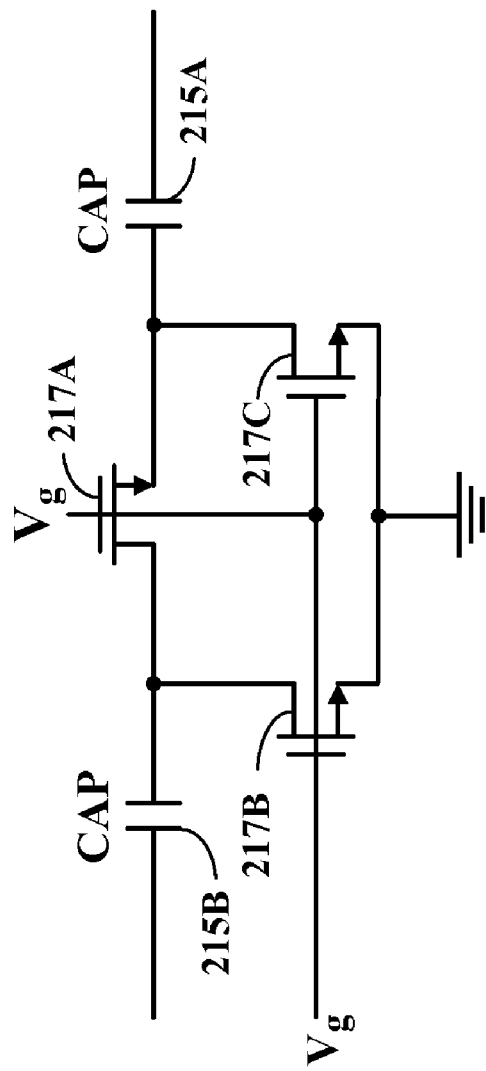
FIG. 2D is a circuit diagram of illustrative tuning elements.

Tuning unit $X_A$, the auxiliary tuning units that may be used to cover cases of nonlinearity (gap or overlap) in the plot of output frequency versus input tuning code as described in this disclosure. In one aspect, the auxiliary tuning unit $X_A$ includes sixteen auxiliary tuning elements, each tuning element including sixteen small capacitors. Thus, in this example, sixteen units $X_A$ would have $16^2$=256 unit capacitors to control, requiring 8 bits binary control from the decoder as shown in FIG. 2C. In this case, an exemplary decoder mapping of tuning code to 16 $X_A$ unit control may be:

Aux MSB (Bit 7) controls 8 $X_A$ units
Bit 6 controls 4 $X_A$ units
Bit 5 controls 2 $X_A$ units
Bit 4 controls 1 $X_A$ units
Bit 3 controls half of the capacitors (8) in the remaining $X_A$ unit
Bit 2 controls four (4) capacitors in the remaining $X_A$ unit
Bit 1 controls two (2) capacitors in the remaining $X_A$ unit
Bit 0 controls one (1) capacitor in the remaining $X_A$ unit FIG. 2D is a circuit schematic of an exemplary digital tuning element 213 for a DCO, such as that found within one of the tuning units (e.g., X) in FIG. 2C. Many of such tuning elements may be included in an array of tuning elements in a DCO, as discussed with reference to FIGS. 2B and 2C. In some cases, 4096 or more digital tuning elements 213 may be included in such an array. Where the digital tuning elements 213 comprise fine tuning elements, each added fine tuning element 213 may provide in one configuration approximately 4 KHz of control to the frequency of the toggling between VP and VN. These digital tuning elements are very useful insofar as they provide sufficient resolution for the control of the frequency of the DCO in increments less than 4 KHz. Of course, the level of resolution of any given DCO remains a design detail that will vary depending on the nature of the application.

Each digital tuning element 213 in one aspect may comprise plate capacitors 215A and 215B, and three transistors 217A, 217B, and 217C between the plate capacitors 215A and 215B. The three transistors 217A, 217B, and 217C may comprise n-channel metal-oxide semiconductor (NMOS) transistors. More specifically, digital tuning element 213 comprises a first plate capacitor 215A, a second plate capacitor 215B, a first transistor 217A that couples the first plate capacitor 215A to the second plate capacitor 215B, a second transistor 217B that couples the second plate capacitor 215B to ground, and a third transistor 217C that couples the first plate capacitor 215A to ground.

The three transistors 217A, 217B, and 217C are, in this example, controlled by a common gate voltage Vg. A drain of the first transistor 217A is coupled to a first one of the plate capacitors 215A and a source of the first transistor 217A is coupled to a second one of the plate capacitors 215B. A drain of the second transistor 217B is coupled to the second one of the plate capacitors 215B and a source of the second transistor 217B is coupled to the ground voltage. A drain of the third transistor 217C is coupled to the first plate capacitor 215A and the source of the third transistor 217C is coupled to the ground voltage.

When the control bit (i.e., the gate voltage Vg to the transistors) is high (digital bit=1), all three transistors 217A, 217B, and 217C will be in the on state. When this occurs, the two capacitors 215A and 215B are effectively shunted to ground, discharging the voltages on the capacitors. When the control voltage (Vg) is low (digital bit=0), all three transistors 217A, 217B, and 217C will be turned off. When this occurs, the two capacitors 215A and 215B will be floating at the sides of the transistors 217A, 217B, and 217C, effectively providing no loading to the circuit. The difference between the two states effectively changes capacitance in the digital tuning array to adjust the output frequency of toggling between VP and VN in a very fine increment. The two transistors 217B and 217C in this example provide fast recovery for the two nodes between capacitors 215B and 215A when the control voltage switches from low to high to maintain the two nodes to approximately ground level.

Figure 3:
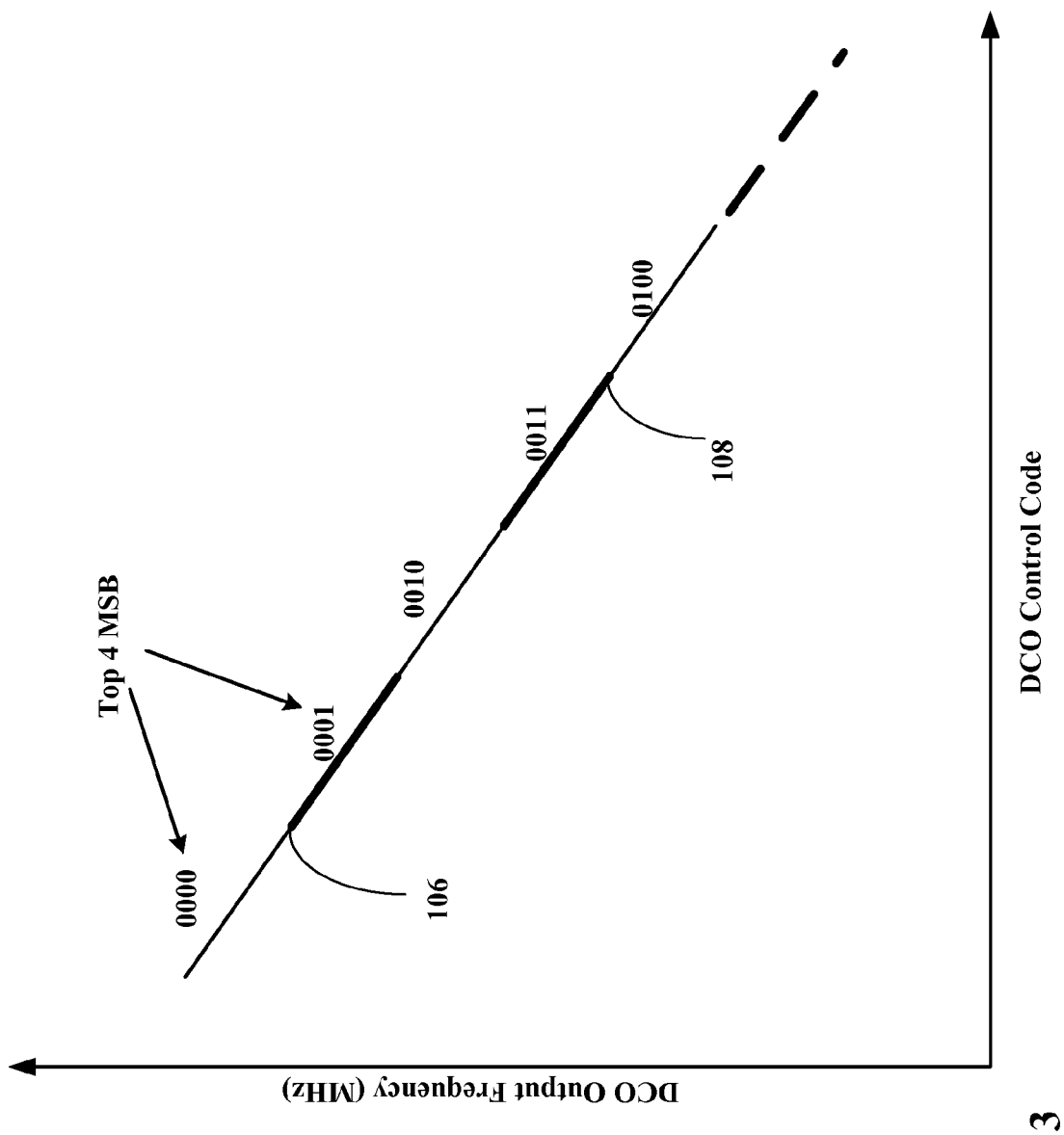
FIG. 3 is a plot showing DCO output frequency versus DCO control code for the ideal case.

FIG. 3 is a plot showing DCO output frequency versus DCO control code for the ideal case. The plot shows DCO control code on the horizontal axis and DCO output frequency in MHz on the vertical axis. The horizontal axis from left to right represents a series of upwardly progressing digital control codes. For the purposes of this example, the control code is a 12 bit digital word comprising 4 most significant bits (MSBs) and 8 least significant bits (LSBs). A plurality of lines or segments are shown, including 0000, 0001, 0010, 0011, and 0100. Each segment is referred to for simplicity by only the top 4 MSBs. One segment corresponds in this example to the entire range of input control codes within a single four-bit MSB value. For example, the segment 0000 contains the range of 12-bit control codes from (0000,0000,0000) to (0000,1111,1111). The next segment 0001 contains the range (0001,0000,0000) to (0001,1111,1111), and so on.

In one embodiment, each segment corresponds to a separate group of tuning elements for adjusting the output frequency based on the input code. For example, in the exemplary DCO characterized by FIG. 3, 4 MSBs correspond to $2^4=16$ segments. Each of the 16 segments may include an array of 256 thermometer encoded elements (for the 8 LSBs). One array may be used for one segment, another array for another segment, and so on. Where the input control code has a length of n bits, then $2^n$ tuning elements may be used. In this example, where a 12 bit DCO is used, then the structure may include at least $2^{12}=4096$ tuning elements. The example shown in FIG. 3, like the circuit of FIG. 2, represents a case of negative KV. That is, because the overall capacitance of the circuit increases as the digital input is increased, the output frequency decreases as a function of an increasing tuning code. In other aspects, the opposite may be the case.

Generally speaking, for the purposes of this embodiment, changes in the 4 MSBs correspond to higher level adjustments in output frequencies, whereas changes in the 8 MSBs correspond to lower level adjustments in the output frequencies. The segments may be implemented in the DCO by a variety of means. In one aspect discussed further below, the DCO is configured with an array of tuning elements that, together with the remaining DCO circuit components (such as, for example, one or more circuit components discussed in connection with FIG. 2, above), collectively provide the adjustments in the output frequency waveform based on the digital input.

Point 106 corresponds to the code switching point from segment (0000,1111,1111) to (0001,0000,0000). In this ideal case, as the code consecutively increases from this first to this next switching point, the frequency plot remains linear, with no tuning step discontinuities between segments. Similarly, the frequency smoothly transitions between consecutive switching points (0011,1111,1111) and (0100,0000,0000) at point 108. Where a DCO in a practical implementation can approximate this linear relationship, substantially increased circuit performance may be realized.

While FIG. 3 shows a straight line depicting a linear tuning frequency as a function of the input control code, in practice, DCOs are not continuous. Unlike the analog VCO, the digital nature of the DCO means that the frequency output can only occur at discrete steps. However, for the majority of applications, the steps can be made very small, such as on the order of a few KHz or less frequency difference between consecutive control codes.

In the ideal case of DCO characterized by FIG. 3, frequency tuning is monotonic over the control code. The output waveform $F_{OUT}$ decreases linearly as a function of the digital input code. Unfortunately, any or a combination of issues such as (1) mismatches in DCO circuit layout, (2) control line impedance and parasitic value differences corresponding to different code segments, and (3) process variations, tuning discontinuities occur which disrupt the linear relationship of frequency versus control code.

Figure 4:
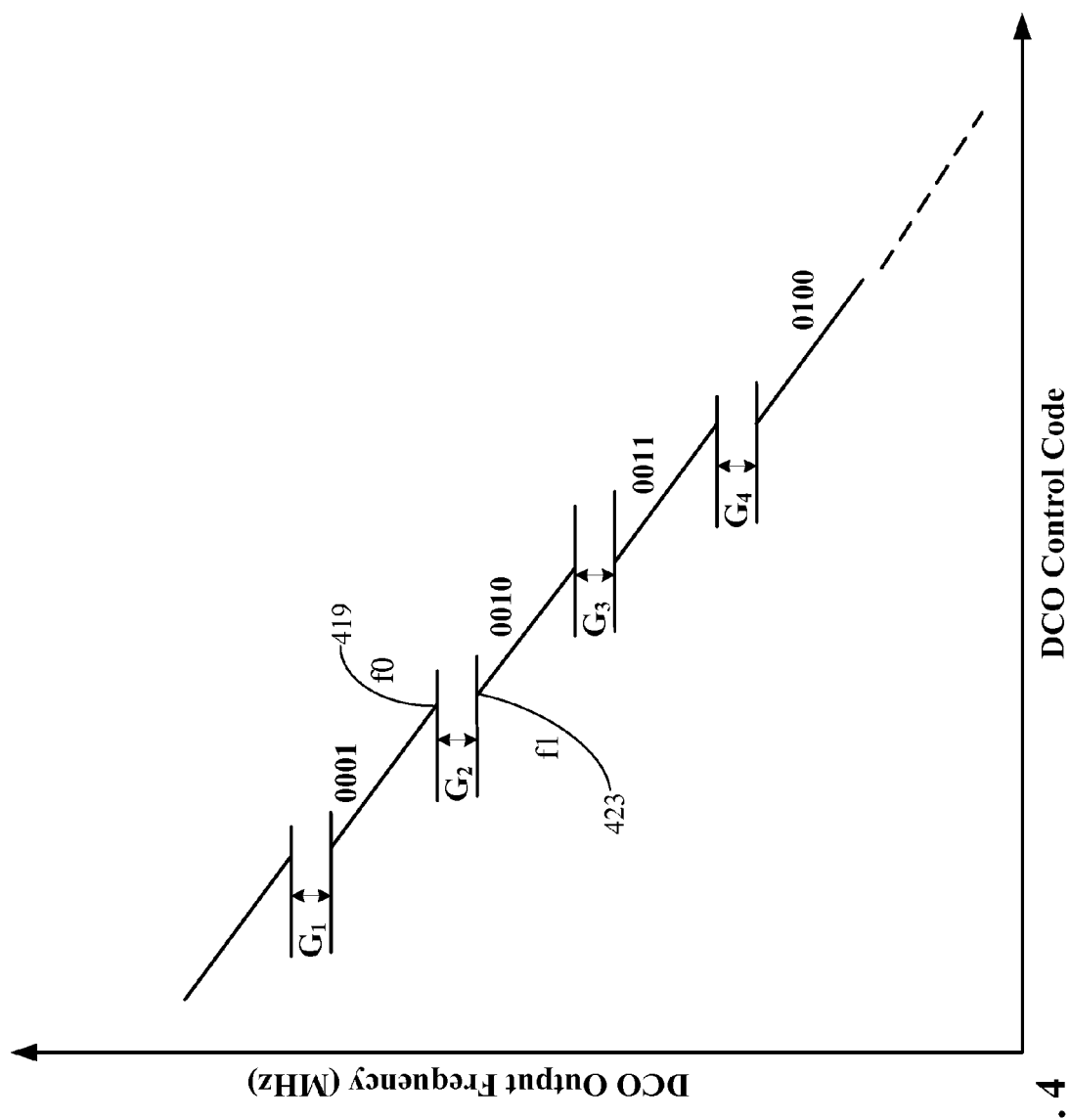
FIG. 4 is a plot is a plot showing DCO output frequency versus DCO control code depicting gaps.

In the example of FIG. 3, layout mismatches, impedance and parasitic variations may occur more prominently between the groups corresponding to different segments. FIG. 4 is a plot showing DCO output frequency versus DCO control code showing gaps. As in FIG. 3, the horizontal axis from left to right represents a series of upwardly progressing digital control codes. The vertical axis shows output frequency of the DCO in MHz. Four gaps $G_1$, $G_2$, $G_3$, and $G_4$ occur between four of the segments 0001, 0010, 0011, and 0100. To illustrate, point 419 represents the rightmost point on segment 0001, i.e. control code (0001,1111,1111), and point 423 represents the leftmost point on segment 0010, i.e., control code (0010,0000,0000). In the ideal case, the frequency f0 of point 419 would decrease to f1 at point 423 corresponding to the next consecutive control code by the same amount (e.g., 4 KHz) that the frequency changes between consecutive control codes in other places within the segment. However, due to practical design limitations as discussed above, a frequency gap $G_2$ exists whereby the DCO output frequency changes by a greater amount (e.g., by 20 KHz instead of 4 KHz) for consecutive control codes. The presence of gaps generally means that missing frequencies points exist that the DCO cannot output under normal operating conditions. Such gaps result in reduced and often unpredictable circuit performance.

Figure 5:
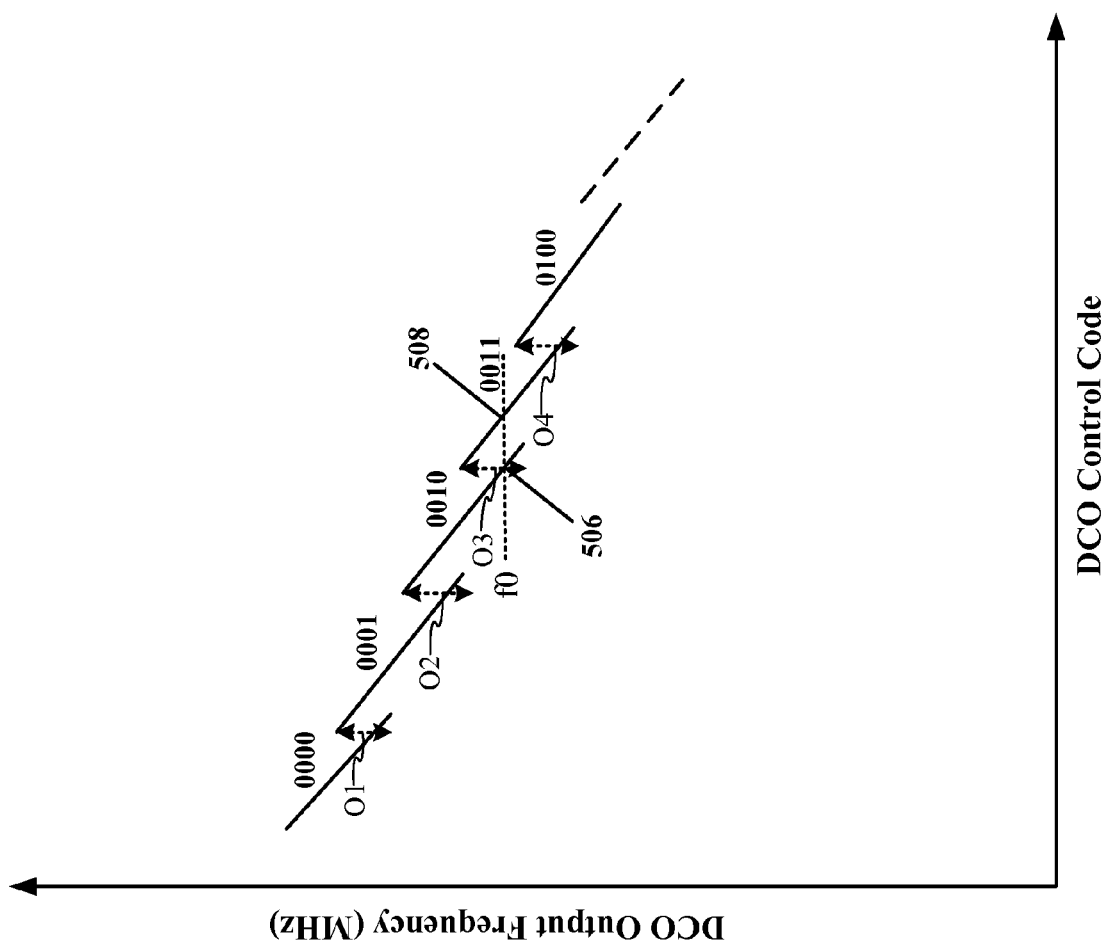
FIG. 5 is a plot showing DCO output frequency versus DCO control code depicting instances of overlap.

FIG. 5 is a plot showing DCO output frequency versus DCO control code depicting occurrences of overlap. Segments 0000 and 0001 contain overlap instance O1, segments 0001 and 0010 contain overlap instance O2, segments 0010 and 0011 contain overlap instance O3, and segments 0011 and 0100 contain overlap instance O4. In the overlap case, more than one control code may correspond to the same frequency. For example, point 506 may correspond to a control code of (0010,1111,1110), whereas point 508 corresponds to (0011,0000,0011). Both control codes in the overlap case may correspond to the same frequency, as illustrated by the dashed line f0. These duplicate frequencies tend to produce unreliable performance in frequency synthesizers and inject phase error into PLLs.

Figure 6:
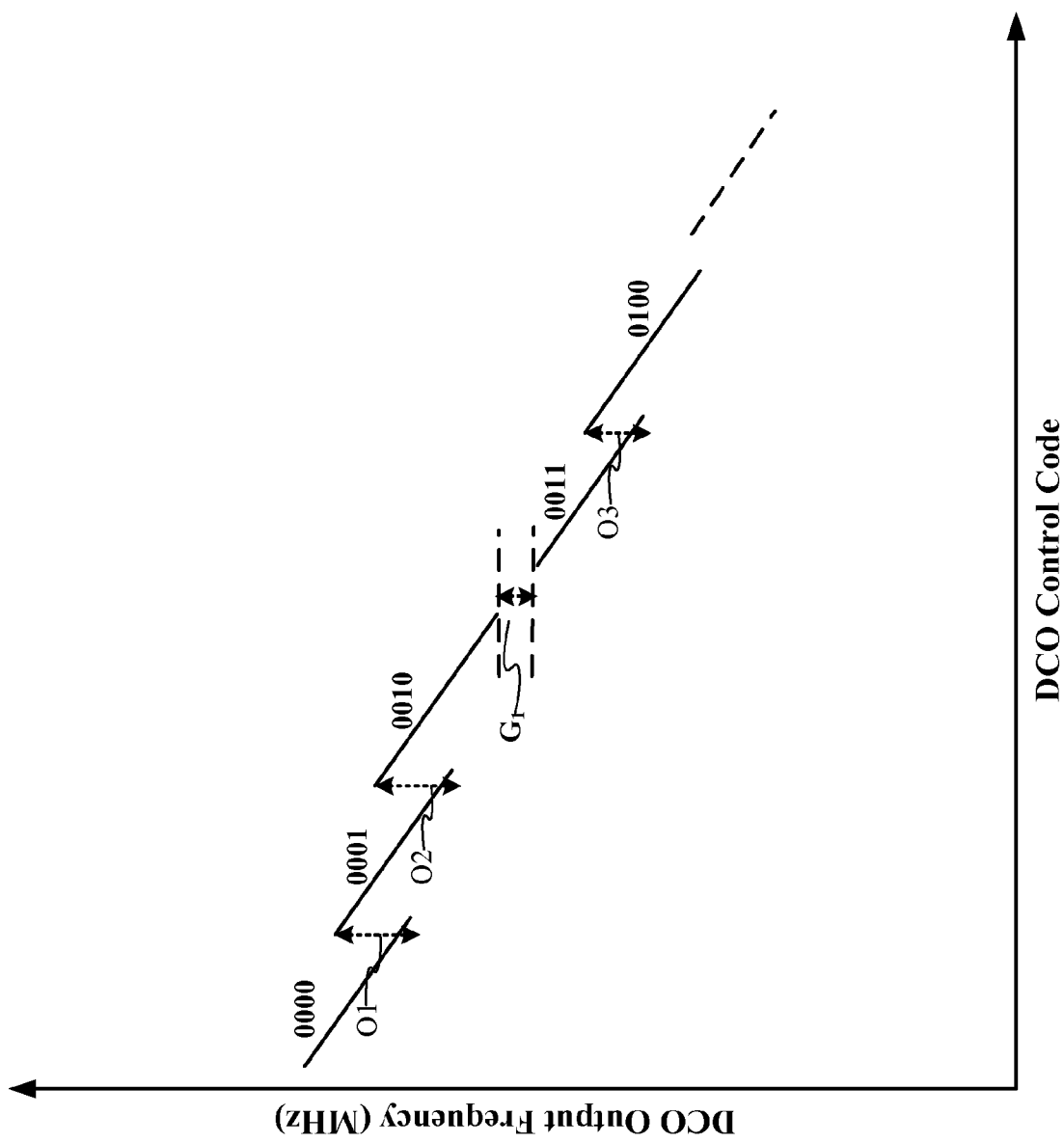
FIG. 6 is a plot showing DCO output frequency versus DCO control code depicting gaps and instances of overlap.

FIG. 6 is a plot showing DCO output frequency versus DCO control code showing discontinuities in the form of both gap G1 and instances O1, O2, and O3 of overlap. In a practical circuit such as, for example, the wireless communication device 100A of FIG. 1A implemented as an integrated circuit in a silicon CMOS process, discontinuities may be present in the form of either gaps or overlaps, or both. The presence of one or the other (or both) may be determined in part by the nature of the layout and circuit mismatches between the arrays of tuning elements that drive segments having consecutive control codes.

Figure 7:
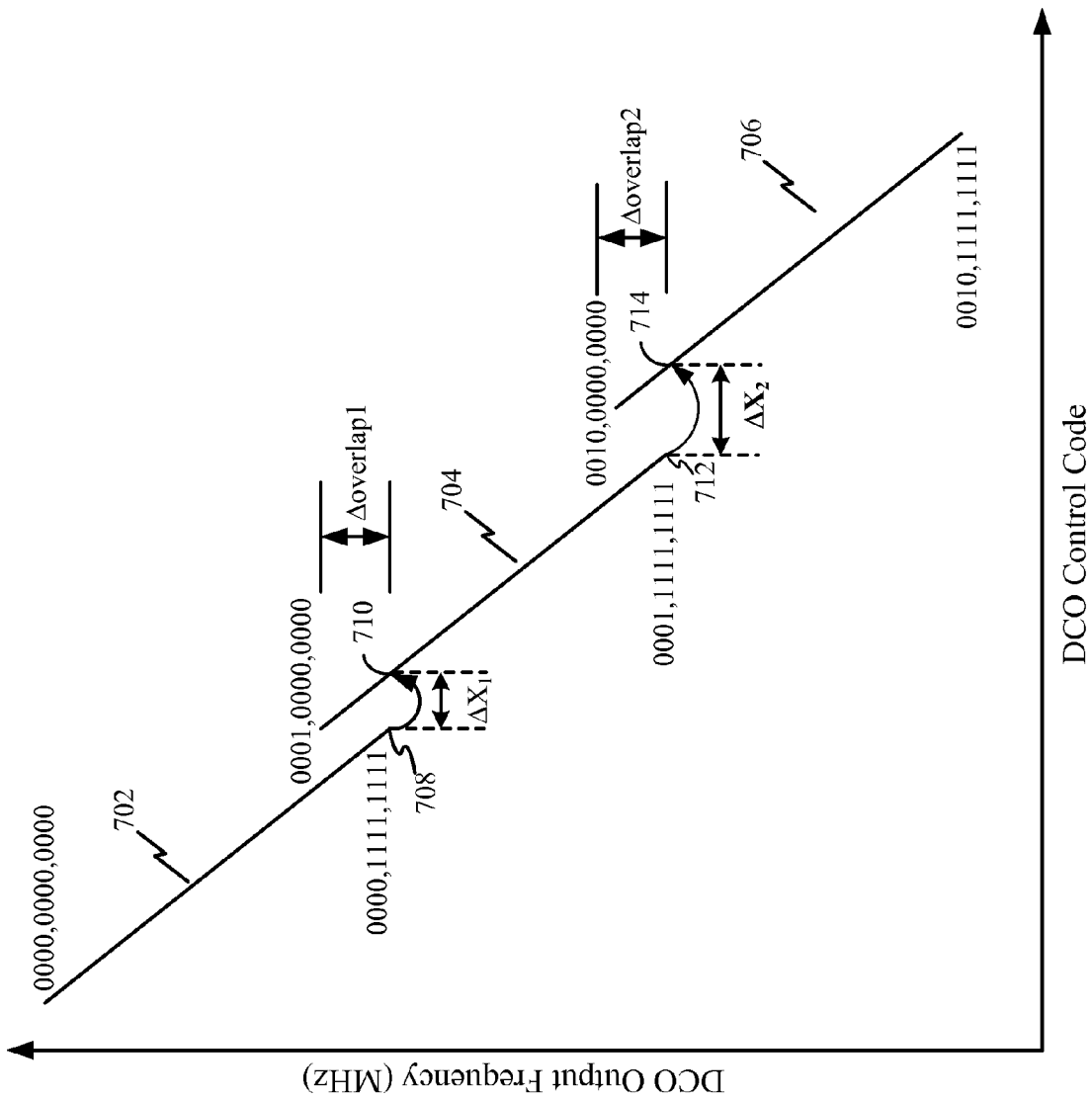
FIG. 7 is a plot showing DCO output frequency versus DCO control code depicting overlap correction.

FIG. 7 is a plot showing DCO output frequency versus DCO control code depicting overlap correction. For clarity in this illustration, each of the twelve bits of the control code are depicted for the three segments 702, 704, and 706. In the DCO characterized by the plot of FIG. 7, two instances of overlap are shown and are characterized by the values ($\Delta x_1$, $\Delta$overlap1) and ($\Delta x_2$, $\Delta$overlap2), respectively.

In an aspect, the DCO in an overlap case may be calibrated by dynamically redefining its inputs. The switching point of the DCO may be changed between segments and a new mapping table may be created based on the new switching point. For example, in FIG. 7, the existing switching points between segments 702 to 704 and between segments 704 to 706 are:

(1.1) (0000,1111,1111)-(0001,0000,0000)
(1.2) (0001,1111,1111)-(0100,0000,0000)

The new code switching points for the three segments are:

(1.3) (0000,1111,1111)-(0001,0000,0000+$\Delta x_1$) (708 to 710)
(1.4) (0001,1111,1111-$\Delta x_1$)-(0001,0000,0000-$\Delta x_1$+$\Delta x_2$) (712 to 714)

where $\Delta x$ represents the amount of corresponding change in the value of the control code relative to $\Delta$overlap, and $\Delta$overlap is the amount of frequency overlap between segments (e.g., in MHz).

In one embodiment discussed in connection with FIGS. 9-14 below, a processing system is coupled to the DCO for identifying discontinuities at initialization or start up of an integrated circuit in which a PLL is embedded. After identifying overlap instances, the processing system creates new code switching points and dynamically stores the new switching points in a mapping table.

Figure 8:
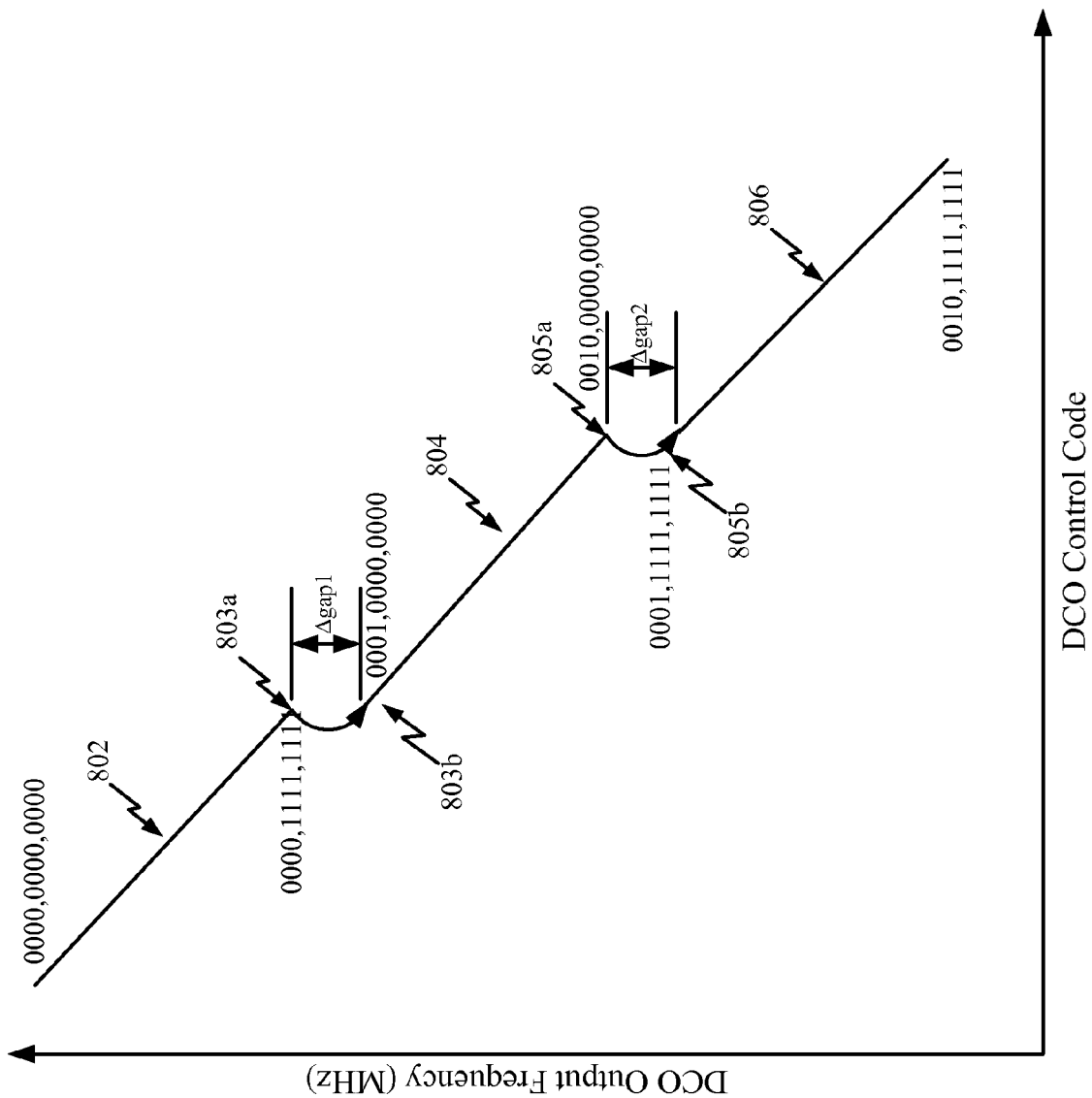
FIG. 8 is a plot showing is a plot showing DCO output frequency versus DCO control code depicting gap correction.

FIG. 8 is a plot showing DCO output frequency versus DCO control code depicting gap correction. Three segments 802, 804, and 806 are shown. The control code is 12 bits. Here again, the particular length of the control code is for illustrative purposes only and another length may be contemplated depending on the application.

A calibration procedure according to an aspect begins by redefining the DCO inputs, as before. However, because in the gap case the DCO is unable to produce certain output frequencies during normal operation, auxiliary tuning elements (FIGS. 12-13) may be used to complement the existing tuning elements in the DCO by providing the necessary frequency adjustments to the DCO output waveform. In one embodiments described below, the auxiliary tuning elements are provided as an array of matched transistor elements adjacent to or part of the DCO circuit module.

The new code switching points for the three segments are:
For the original tuning code row switching point: (0000, 1111,1111)-(0001,0000,0000), the frequency step gap $\Delta$gap1 will need to be compensated by the auxiliary tuning element by turning off AUX($\Delta$gap1) elements to compensate this frequency gap and overall for this switching the tuning step will become linear. (803a to 803b). For the original tuning code row switching point: (0001,1111,1111)-(0010,0000,0000), the frequency step gap $\Delta$gap2 will need to be compensated by the auxiliary tuning element by turning off AUX($\Delta$gap2) elements to compensate this frequency gap and overall for this switching the tuning step will become linear. (805a to 805b).

For this example with 15 switching points from 16 rows of tuning nonlinearity, there are a total of 15 auxiliary tuning elements to compensate the gap cases. The 15 auxiliary tuning elements may, but need not, be discrete, and can be obtained, for example, from a large auxiliary tuning element with different controls for different switching points. This is explained below.

In this illustration, the number of auxiliary elements to be employed may depend on a number of factors such as the width of the gap, the frequency resolution of the DCO, and other factors. In general, a smaller frequency resolution of the DCO means that more auxiliary tuning elements will be needed to compensate for missing output frequencies.

The above code switching techniques described in FIGS. 7 and 8 can be implemented as an encoder containing the new mapping wherein (1) equations (1.3) and (1.4) may be generalized for y occurrences of overlaps for all DCO segments, and (2) equations (1.7) and (1.8) may be generalized for z occurrences of gaps for all DCO segments. The new output frequency waveforms for the gap case may be realized using selected tuning elements of the auxiliary input code array.

The following equations present, in one aspect, a generalized case for gap and overlap using one or more decoders such as illustrated with reference to FIG. 2B to correct DCO row tuning nonlinearities. In this example, a total of sixteen rows are considered and are numerically assigned rows 0000, 0001,0010, . . . . . . 0111, 1000, 1001, 1010, . . . 1111. It is further assumed that for purposes of this example that a discontinuity between each adjacent row has been identified and measured (see FIGS. 9 and 10).

In one aspect, for the overlap case, we denote the overlap frequency between adjacent rows corresponding to the four least significant bits (lsb) of OVR of the tuning step, i.e. OVR(0000, 0001) to be the overlap code between row 0000 and 0001 switching. For the GAP case, we denote the gap frequency between adjacent rows corresponding to the GAP lsb of the tuning step, i.e. GAP(0000, 0001) as the gap code between row 0000 and 0001 switching. For each switching point, only one case exists, either GAP or OVR.

For this exemplary decoder function, we start from the middle code 1000. When the control code is in row 1000, default may be used without performing any correction. The following equations describe how decoder works:

Input<11:0> [12 bits]
Output_aux<7:0>[8 bits] which is the control for the auxiliary tuning element; assume the lsb of this one matches the lsb of the main DCO tuning code lsb for simplicity.
Case(row):
1000: output_aux=1000,0000 (At row 1000, the auxiliary tuning elements block code is in the center 1000,0000 with half tuning elements on and half off; this configuration provide optimum coverage for all conditions)
1001: output_aux=1000,0000+OVR(1000,1001)−GAP (1000,1001)
1010: output_aux=1000,0000+OVR(1000,1001)−GAP (1000,1001)+OVR(1001,1010)−GAP(1001,1010)
1011: output_aux=1000,0000+OVR(1000,1001)−GAP (1000,1001)+OVR(1001,1010)−GAP(1001,1010)+ OVR(1010,1011)−GAP(1010,1011) . . . (similar equations for row 1100, 1101, 1110, 1111 with same principle)
0111: output_aux=1000,0000−OVR(0111,1000)+GAP (0111,1000)
0110: output_aux=1000,0000−OVR(0111,1000)+GAP (0111,1000)−OVR(0110,0111)+GAP(0110,0111)
0101: output_aux=1000,0000−OVR(0111,1000)+GAP (0111,1000)−OVR(0110,0111)+GAP(0110,0111)− OVR(0101,0110)+GAP(0101,0110) . . . (similar equations for row 0100, 0011, 0010, 0001,0000 with same principle)

FIG. 9A is a diagram of a calibration circuit for measuring DCO discontinuities using a closed loop PLL. The technique shown herein is well suited for applications involving integrated circuits using DPLLs, however, the technique can be used for any application where a PLL is involved and at least one DCO provides an oscillator function for the PLL. The technique can be employed either as a "factory" procedure (or by the chip supplier, etc.), or alternatively, it can be an automated process upon device startup or chip initialization. The calibration circuit can work in conjunction with "on board" processing circuitry to implement the calibration function (see FIG. 13); alternatively, an off chip module or external computer may be used to calibrate the device.

The tuning mechanism in FIG. 9A relies on operating the PLL and taking voltage or current measurements off the loop filter. However, it will be appreciated by those skilled in the art that other points in the closed loop PLL system may be equally suitable for taking the measurements described herein. Using the calibration circuit of FIG. 9A, the frequency response across the DCO segments may be quantified by measuring the corresponding DCO RMS control value at the loop filter in closed loop operation. In general, the DCO control code will tend to have an appreciable RMS error in a PLL closed-loop operation when overlaps or gaps are present. A measurement of the magnitude of such errors provide a quantification of the necessary amount of correction.

Control line 912, which is coupled to the input of low pass filter (LPF) 902, is also coupled to the output of the loop filter (not shown) from a PLL associated with the DCO to be calibrated. Thus, line 912 represents the closed loop DCO control code. A filtered version 913 of the control code (via LPF 902) is compared with itself at comparator 904 to yield output waveform 915. RMS Detector 906 measures the DCO control RMS value of waveform 915 as value 919. The value is filtered (917), then compared at comparator 910 with a program threshold value 914 to determine the presence of a gap or overlap as output 916.

FIG. 9B is a series of plots showing the waveforms for the circuit of FIG. 9A. Dashed waveform 918 shows the DCO control code 912 in the presence of DCO discontinuities, while waveform 920 shows the control code 912 with substantially no discontinuities. Waveform 918 has a significantly greater amount of oscillation, reflecting the instability of the closed loop as it tries to phase correct itself to account for the discontinuity. LPF 902 is used to remove high frequency noise from waveform 912, and the resulting comparison produces waveform 915. Waveform 915 produces similar waveforms to that of 912, centered at a zero voltage in light of the comparison.

The RMS detector 906 measures the corresponding RMS value for the discontinuity. The RMS measurement may be more useful in the sense that the voltage output of a closed loop system generally will oscillate due to the noise inherent in the feedback loop. If there is a discontinuity in the tuning range and the DCO is locked close to this range, the DCO will move around this discontinuity and the loop will become noisier as it jumps around to attempt to compensate in response to the discontinuity. An RMS detector can therefore be used to quantify the magnitude of the discontinuity. RMS detector can be implemented using a variety of means. Generally, RMS detector 906 may comprise any circuit capable of measuring either the absolute value or the AC RMS value of the voltage at the output of the PLL loop filter, which may be stored in non-volatile memory. In one aspect, RMS detector 906 is implemented as a digital signal processor which records the current comparator 904 output value, squares it, adds it to the previous squared value, then takes the square root of a prescribed number of samples. Waveform 917 shows the output of the RMS detector 906 as an absolute value. Where a gap is present, the waveform 917 generally will jump to a higher or lower bandwidth.

The measured value 919 of the discontinuity is next compared to a programmed threshold 914 in comparator 910 to determine whether a discontinuity in fact exists. Generally, the programmed threshold 914 will be defined to prescribe some degree of tolerance of acceptability, above which very small discontinuities deemed not to unduly impact performance in light of the criteria deemed important for the application are considered acceptable. The programmed threshold 914 may vary based on the needs of the application and the desired precision of the device.

For each trial code, the DPLL control code can be programmed to sweep across the DCO segments to measure the corresponding tuning RMS value for both gap and overlap. The DCO can be characterized to obtain the minimized trial code range. The RMS value measurement is a built-in functional in DPLL; that is, the measurement is a function of the internal configuration of the DPLL. Different frequency bands can have different correction codes. Generally, using the RMS value obtained from the circuit in FIG. 9A, an estimation for the magnitude of the gap and/or overlap measurements can be obtained. In one configuration, the DCO can be swept using the estimated values and the output values remeasured. Using this trial and error approach, precise correction values of gap and overlap may be obtained.

Figure 10A:
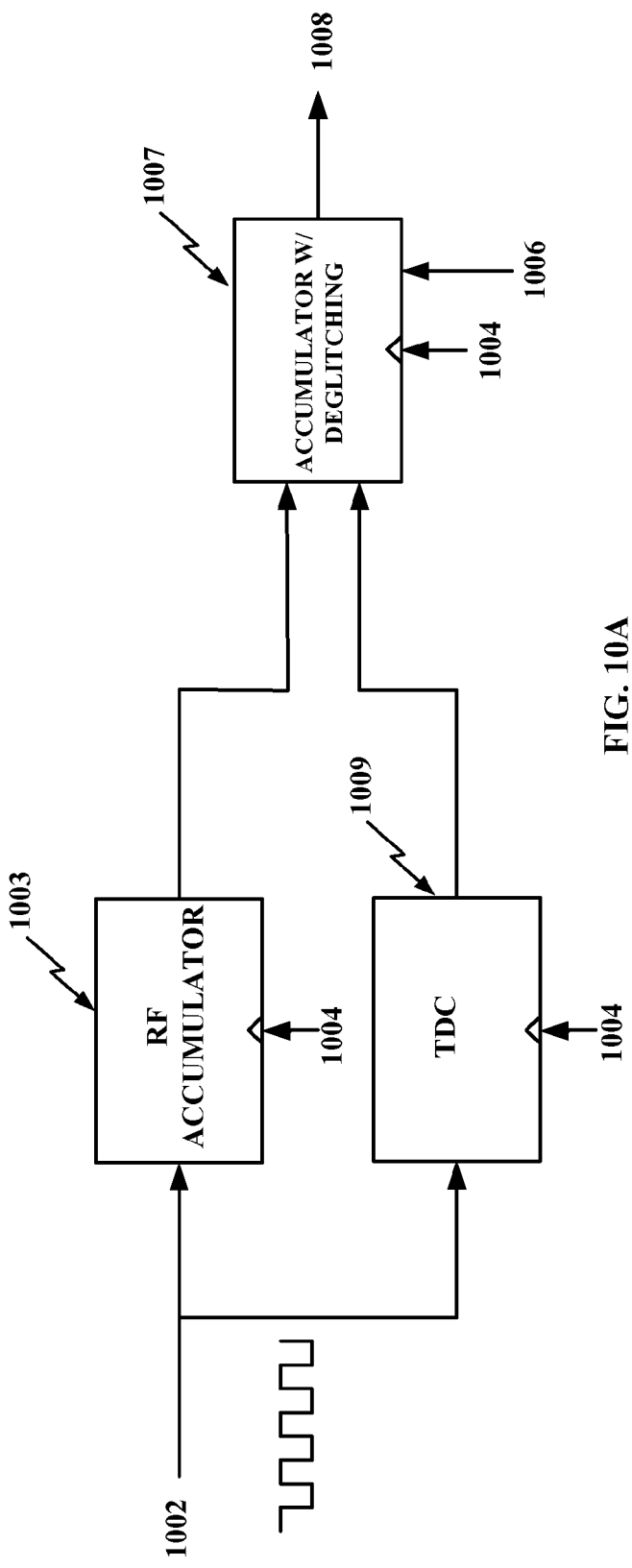
FIG. 10A is a diagram of a circuit for measuring DCO discontinuities using an open loop DCO frequency.
Figure 10B:
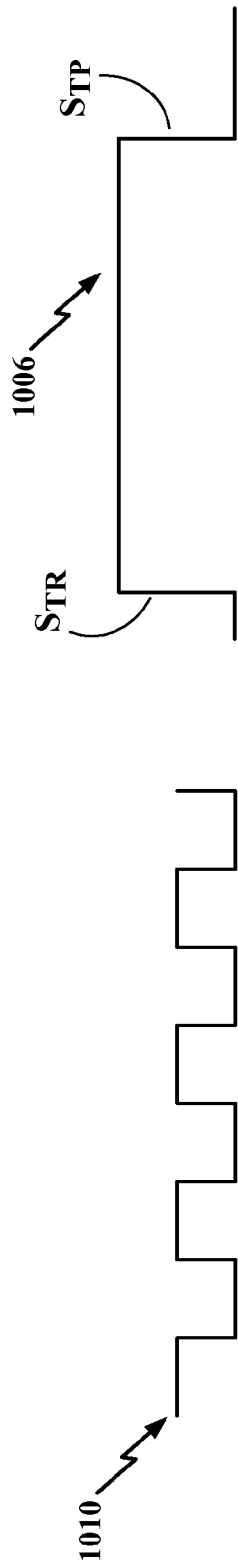
FIG. 10B shows waveforms for the circuit of FIG. 10A.

In another aspect, the open loop frequency of the DCO may be measured to determine overlap and gap occurrences and quantify these values for calibration. A PLL is not needed, meaning that a DCO in any circuit application can be calibrated using this approach. DCO frequency may be measured using an accumulator and a time to digital converter for providing integer and fractional cycle counts, respectively. FIG. 10A is a diagram of a calibration circuit for measuring DCO discontinuities using an open loop DCO frequency. The range of DCO control codes is input at 1002 into an RF accumulator 1003 and a time to digital converter (TDC) 1009, both of which are driven by a reference frequency 1004 of the type 1010 (FIG. 10B). The frequency counter configuration enables a determination of the frequency based on a cycle count. RF accumulator 1003 measures the integer count, whereas TDC 1004 measures the fractional count. In some configurations, an adder may be used in the event of an accumulator overflow. In the example shown, RF accumulator 1003 is a 20 bit accumulator.

The outputs of RF accumulator 1003 and TDC 1009 are provided to accumulator with deglitching block 1007. Accumulator with deglitching block 1007 is also supplied with reference frequency 1004 and with enable/disable input 1006 (FIG. 10B). Enable/disable input 1006 includes a rising edge $S_{TR}$ which triggers the beginning of the cycle count, and a falling edge $S_{TP}$ which terminates the cycle count. Output waveform 1008 is produced.

In an aspect, the output of RF accumulator 1003 is a modulo accumulator output, and the output of negative feedback element 1005 is an accumulator step output. Accumulator with deglitching block 1007 may resolve any timing offset between the integer and fractional waveforms. In this fashion, block 1007 may include a detection circuit which lines up the cycle counts in time. The output 1008 is a measurement of DCO cycles for the prescribed measurement period. Discontinuities may be determined and quantified based on identifying different cycle counts for different tuning codes. Output frequency of the DCO is obtained by taking the inverse of the cycle count. The range of input codes can be input and the corresponding measurements can be taken across the DCO to correct other nonlinearities.

Figure 11:
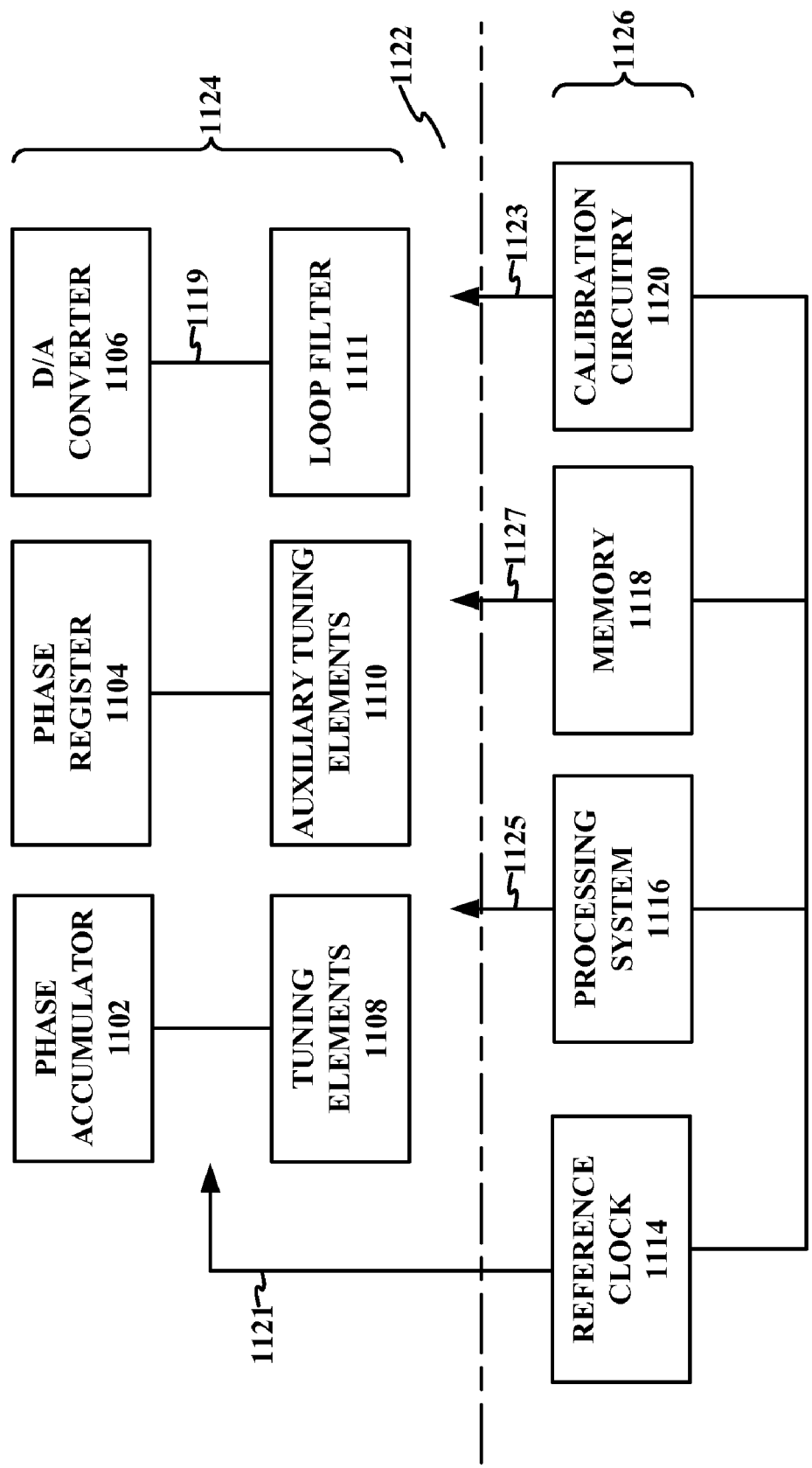
FIG. 11 is a block diagram of components for tuning a DCO.

FIG. 11 is a block diagram of components for tuning a DCO. Component set 1124 includes phase accumulator 1104, phase register 1104, DAC 1106, tuning elements 1108, auxiliary tuning elements 1110, and loop filter 1111. Component set 1126 includes reference clock 1114, processing system 1116, memory 1118, and calibration circuitry 1120. The reference clock 1114 may comprise a crystal oscillator used for the DCO. In one aspect, component sets 1124 and 1126 are implemented on an integrated circuit, such as the wireless communication device 100A or 100B of FIG. 1. For example, the component sets 1124 and 1126 may reside on a CDMA transceiver chip for use within a mobile station for transmitting and receiving wireless signals to and from a base station. The transceiver chip may include a digital block which includes various digital signal processing functions as well as an application processor. One or more of these blocks act as the processing system 1116. Memory 1118 may be included as one or more on-chip buffers or registers. Calibration circuitry 1120 may include one or more of the circuit components illustrated in FIG. 9A and FIG. 10A for determining values for gap and overlap.

In other aspects, the functions of component set 1126 may be realized on another chip or module. For example, processing system 1116 may be included as another chip in a chipset. Alternatively, the processing may be performed in software by a local computer at a bench station. Memory 1118 may be a separate memory from the chip where the DCO resides, such as a RAM, ROM, PROM, hard drive, removable storage, or another suitable media. The calibration circuitry 1120 may be integrated into the digital signal processing circuitry or into the software algorithms. Alternatively, it may be provided on another module. In one aspect, an on-chip application processor, memory buffer, comparator set, accumulator, time to digital converter and accumulator to deglicher are all provided on one CDMA transceiver chip containing a DPLL with a DCO. It will be appreciated, however, that any type of circuit device using a DCO may be used, and a DPLL is not required.

The components in set 1124 are grouped merely to indicate the interaction between these components as functionally part of the DPLL, rather than to indicate that they are necessarily physically proximate or that the set 1126 is functionally distinct. Lines 1119 serve to indicate the general functional relationship between components in set 1126 rather than any specific relationship between the two linked components. Line 1122 indicates that, in one aspect, the two component sets (or some variation thereof) may be segregated into different sets or modules. Lines 1121, 1125, 1127, and 1123 also demonstrate the interaction between the components of set 1126 with those of set 1124.

Auxiliary tuning elements 1110 are shown in set 1124. For gap cases, one or more such tuning elements are selected as discussed above.

Figure 12:
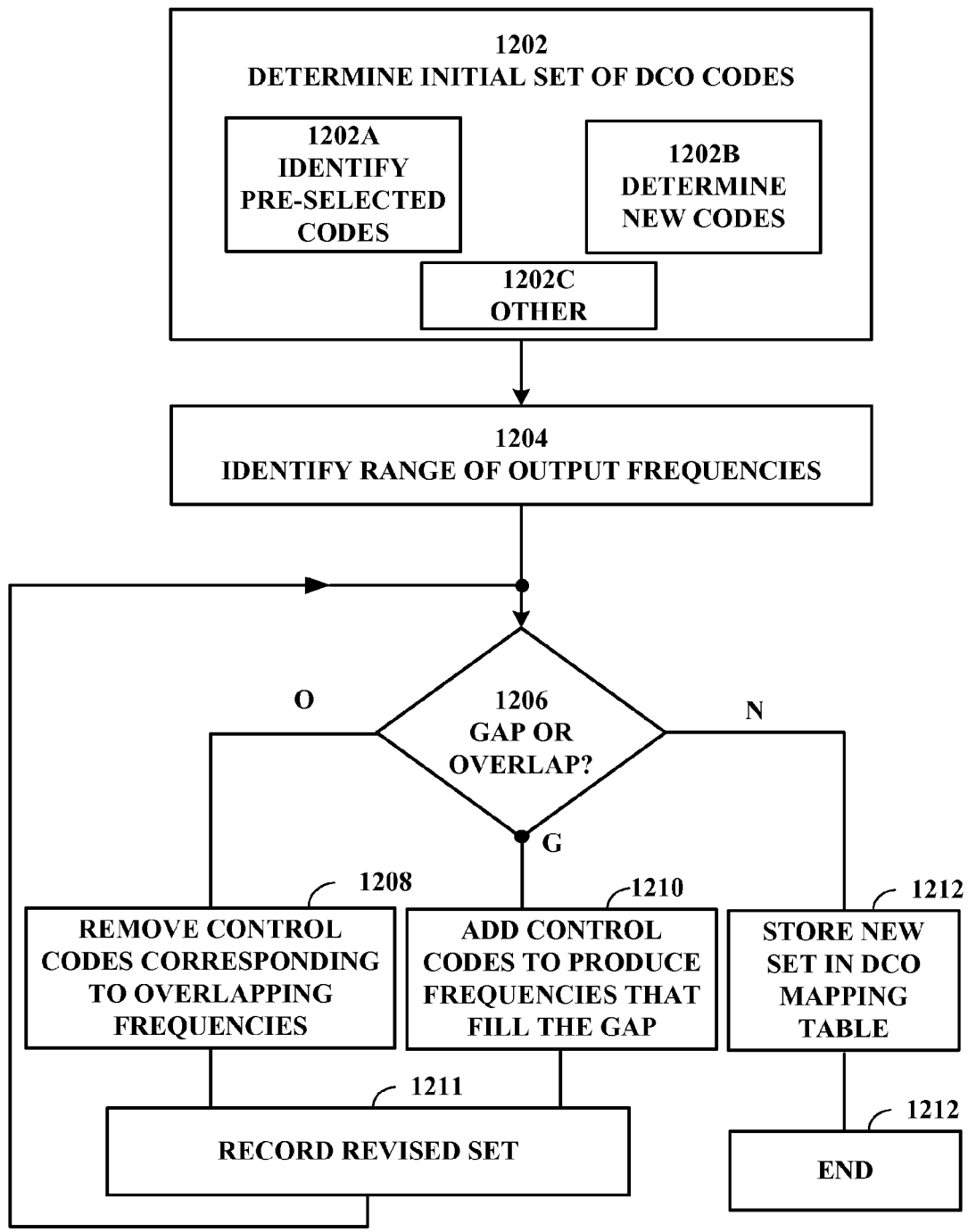
FIG. 12 is a flow diagram of a method for tuning a DCO.

FIG. 12 is a flow diagram of a method for calibrating a DCO in accordance with an aspect of the disclosure. At 1202, an initial set of DCO codes are determined for use with the DCO. The determination of this initial set may simply be an identification of a specified set of codes (1202A) designated by a manufacturer or chip supplier. Alternatively, the determination may involve determining a new set of codes (1202B), such as at a testing facility or in a procedure done by a supplier. The determination may be done in other ways (1202C), such as a combination of using known codes along with making custom determinations. In an aspect, the initial set is stored in on-chip memory 1118.

A range of output frequencies is thereupon identified (1204). In an aspect, this step is automated by the processing system 1116 via code written and stored in on-chip memory 1118, and performed by the processing system 1316 along with calibration circuitry 1120 using one or more of the techniques discussed with reference to FIGS. 9 and 10. For example, a frequency counter may be used at the output of the accumulator 1007 in FIG. 9 to count the number of cycles, which in turn can be used to determine the output frequency for each input code.

The presence of gaps and overlaps in the frequency range are determined (1206). In some aspects, steps 1204 and steps 1206 are not consecutive, but rather repeat in sequence for each a plurality of input codes in the initial set. In other aspects, step 1204 may occur first. A variety of configurations are possible without departing from the spirit and scope of the disclosure. If an overlap is present, the control codes corresponding to the overlapping frequencies may be removed (1208), and a revised set of control codes is recorded (1211). If a gap is present, control codes are added to produce frequencies to fill the gap (1210), and the revised set is recorded. Control may revert back to 1206 in the configuration where one, a subset, or a segment of control codes are analyzed at a time.

After no more discontinuities are identified, the new set may be stored in a DCO mapping table, which may comprise a non-volatile memory. At that point, calibration is complete and the process ends (1212).

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The various illustrative logical blocks, modules, and circuits described in connection with the aspects disclosed herein, including the processing system 1316 of FIG. 13, may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA"), an entertainment device (e.g., a music or video device), a headset (e.g., headphones, an earpiece, etc.), a microphone, a medical device (e.g., a biometric sensor, a heart rate monitor, a pedometer, an EKG device, etc.), a user I/O device (e.g., a watch, a remote control, a light switch, a keyboard, a mouse, etc.), a tire pressure monitor, a computer, a point-of-sale device, an entertainment device, a hearing aid, a set-top box, or any other suitable device.

The teachings herein are not limited to wireless devices, but may extend to any electronic device, module, or circuit, in which a DCO is or can be implemented. Such a device may include an IC or processor in itself, or another electrical circuit component, whether a "stand alone" component or module or an integrated part of another module or electronic device.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A method of calibrating a digitally controlled oscillator (DCO), comprising:
   determining an initial set of tuning codes for operating the DCO;
   identifying a range of output frequencies produced from the initial set;
   identifying at least one instance of overlap in the frequency range; and
   removing tuning codes from the initial set that correspond to the at least one overlap instance to establish a revised set.

2. The method of claim 1, further comprising:
   identifying at least one gap in the frequency range; and
   adding tuning codes to the initial set, the added tuning codes corresponding to output frequency values that substantially fill the at least one gap.

3. The method of claim 1, wherein the initial set and revised set are encoded in a mapping table.

4. The method of claim 1, wherein the DCO is part of a phase-locked loop (PLL).

5. The method of claim 4, wherein the identifying at least one instance of overlap comprises measuring an alternating current (AC) root-mean squared (RMS) control value of the PLL.

6. The method of claim 1, wherein the identifying at least one instance of overlap comprises measuring the corresponding output frequency for a plurality of consecutive tuning codes of the initial set.

7. The method of claim 6, wherein the identifying at least one instance of overlap is performed at chip initialization.

8. A wireless communication device, comprising:
   a digitally controlled oscillator (DCO); and
   a processing system configured to determine an initial set of tuning codes for operating the DCO, to identify a range of output frequencies produced from the initial set, to identify at least one instance of overlap in the frequency range, and to remove tuning codes from the initial set that correspond to the at least one overlap instance to establish a revised set.

9. The wireless communication device of claim 8, wherein the processing system is further configured to identify at least one gap in the frequency range, and to add tuning codes to the initial set, the added tuning codes corresponding to output frequency values that substantially fill the at least one gap.

10. The wireless communication device of claim 8, wherein the initial set and revised set are stored in a mapping table.

11. The wireless communication device of claim 8, wherein the DCO is part of a phase-locked loop (PLL).

12. The wireless communication device of claim 11, wherein the identifying at least one instance of overlap comprises measuring an alternating current (AC) root-mean squared (RMS) control value of the PLL.

13. The wireless communication device of claim 8, wherein the identifying at least one instance of overlap comprises measuring the corresponding output frequency for a plurality of consecutive tuning codes of the initial set.

14. The wireless communication device of claim 13, wherein the identifying at least one instance of overlap is performed at chip initialization.

15. An apparatus, comprising:
   a digitally controlled oscillator (DCO);
   means for determining an initial set of tuning codes for operating the DCO;
   means for identifying a range of corresponding output frequencies;
   means for identifying at least one instance of overlap in the frequency range; and
   means for removing tuning codes from the initial set that correspond to the at least one overlap instance to establish a revised set.

16. The apparatus of claim 15, further comprising:
   means for identifying at least one gap in the frequency range;
   means for tuning codes to the initial set, the added tuning codes corresponding to output frequency values that substantially fill the at least one gap.

17. The apparatus of claim 15, wherein the initial set and revised set are stored in a mapping table.

18. The apparatus of claim 15, wherein the DCO is part of a phase-locked loop (PLL).

19. The apparatus of claim 18, wherein the means identifying at least one instance of overlap comprises means for measuring an alternating current (AC) root-mean squared (RMS) control value of the PLL.

20. The apparatus of claim 15, wherein the means for identifying at least one instance of overlap comprises means for measuring the corresponding output frequency for a plurality of consecutive tuning codes of the initial set.

21. The apparatus of claim 20, wherein the identifying at least one instance of overlap is performed at chip initialization.

22. A computer-program product comprising a machine-readable medium comprising instructions executable by a machine for performing a method of tuning a digitally controlled oscillator (DCO), comprising determining an initial set of tuning codes for operating the DCO, identifying a range of output frequencies produced from the initial set, identifying at least one instance of overlap in the frequency range, and removing tuning codes from the initial set that correspond to the at least one overlap instance to establish a revised set.

23. A method of calibrating a digitally controlled oscillator (DCO), comprising:
  determining an initial set of tuning codes for operating the DCO;
  identifying a range of output frequencies produced from the initial set;
  identifying at least one gap in the frequency range; and
  adding tuning codes to the initial set, the added tuning codes corresponding to output frequency values that substantially fill the at least one gap.

24. The method of claim 23, wherein one or more tuning elements are used to generate the output frequencies produced from the initial set.

25. The method of claim 24, wherein one or more auxiliary tuning elements are used to generate the frequency values produced from the added tuning codes.

26. The method of claim 23, further comprising
  identifying at least one instance of overlap in the frequency range; and
  removing tuning codes from the initial set that correspond to the at least one overlap instance.

27. The method of claim 23, further comprising establishing a revised set of tuning codes based on the initial set of tuning codes and the added tuning codes, wherein the initial set and revised set are encoded in a mapping table.

28. The method of claim 23, wherein the DCO is part of a phase-locked loop (PLL).

29. The method of claim 28, wherein the identifying at least one gap comprises measuring an alternating current (AC) root-mean squared (RMS) control value.

30. A wireless communication device, comprising:
  a digitally controlled oscillator (DCO); and
  a processing system configured to determine an initial set of tuning codes for operating the DCO, to identify a range of output frequencies produced from the initial set to identify at least one gap in the frequency range, and to add tuning codes to the initial set, the added tuning codes corresponding to output frequency values that substantially fill the at least one gap.

31. The wireless communication device of claim 30, further comprising one or more tuning elements configured to generate the output frequencies produced from the initial set.

32. The wireless communication device of claim 31, further comprising one or more auxiliary tuning elements configured to generate the frequency values produced from the added tuning codes.

33. The wireless communication device of claim 30, wherein the processing system is further configured to identify at least one instance of overlap in the frequency range, and to remove tuning codes from the initial set that correspond to the at least one overlap instance.

34. The wireless communication device of claim 33, wherein the processing system is further configured to establish a revised set of tuning codes based on the initial set of tuning codes and the added tuning codes, wherein the initial set and revised set are encoded in a mapping table.

35. The wireless communication device of claim 30, wherein the DCO is part of a phase-locked loop (PLL).

36. The wireless communication device of claim 30, wherein the identifying at least one gap comprises measuring an alternating current (AC) root-mean squared (RMS) control value.

37. An apparatus, comprising:
  a digitally controlled oscillator (DCO);
  means for determining an initial set of tuning codes for operating the DCO;
  means for identifying a range of output frequencies produced from the initial set;
  means for identifying at least one gap in the frequency range; and
  means for adding tuning codes to the initial set, the added tuning codes corresponding to output frequency values that substantially fill the at least one gap.

38. The apparatus of claim 37, further comprising one or more tuning elements used to generate the output frequencies produced from the initial set.

39. The apparatus of claim 38, further comprising one or more auxiliary tuning elements used to generate the frequency values produced from the added tuning codes.

40. The apparatus of claim 37, further comprising
  means for identifying at least one instance of overlap in the frequency range; and
  means for removing tuning codes from the initial set that correspond to the at least one overlap instance.

41. The apparatus of claim 37, further comprising means for establishing a revised set of tuning codes based on the initial set of tuning codes and the added tuning codes, wherein the initial set and revised set are encoded in a mapping table.

42. The apparatus of claim 37, wherein the DCO is part of a phase-locked loop (PLL).

43. The apparatus of claim 42, wherein the means for identifying at least one gap comprises means for measuring an alternating current (AC) root-mean squared (RMS) control value.

44. A computer-program product comprising a machine-readable medium comprising instructions executable by a machine for performing a method of tuning a digitally controlled oscillator (DCO), comprising determining an initial set of tuning codes for operating the DCO, identifying a range of output frequencies produced from the initial set, identifying at least one gap in the frequency range, and adding tuning codes to the initial set, the added tuning codes corresponding to output frequency values that substantially fill the at least one gap.

* * * * *